United States Patent
Tsuchiyama

(10) Patent No.: US 11,031,799 B2
(45) Date of Patent: Jun. 8, 2021

(54) POWER SUPPLY MANAGEMENT INTEGRATED CIRCUIT, ELECTRONIC DEVICE, AND CONTROL METHOD OF POWER SUPPLY MANAGEMENT INTEGRATED CIRCUIT

(71) Applicant: Sony Corporation, Tokyo (JP)

(72) Inventor: Tomonori Tsuchiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 131 days.

(21) Appl. No.: 15/778,372

(22) PCT Filed: Sep. 9, 2016

(86) PCT No.: PCT/JP2016/076571
§ 371 (c)(1),
(2) Date: May 23, 2018

(87) PCT Pub. No.: WO2017/094311
PCT Pub. Date: Jun. 8, 2017

(65) Prior Publication Data
US 2018/0331552 A1 Nov. 15, 2018

(30) Foreign Application Priority Data
Dec. 1, 2015 (JP) .............................. JP2015-234403

(51) Int. Cl.
*H02J 7/00* (2006.01)
*G01R 31/382* (2019.01)
(Continued)

(52) U.S. Cl.
CPC .......... *H02J 7/0047* (2013.01); *G01R 31/382* (2019.01); *G06F 1/26* (2013.01);
(Continued)

(58) Field of Classification Search
CPC ......................................................... G06F 1/28
(Continued)

(56) References Cited

U.S. PATENT DOCUMENTS

| | | | | |
|---|---|---|---|---|
| 2012/0200264 | A1* | 8/2012 | Choi .................. | H02J 3/32 320/132 |
| 2015/0318726 | A1* | 11/2015 | Luo ..................... | H02J 7/00714 320/134 |
| 2015/0355285 | A1* | 12/2015 | Nishigaki ............ | H01M 10/48 324/429 |

FOREIGN PATENT DOCUMENTS

| | | | | |
|---|---|---|---|---|
| JP | 11-003153 | * | 1/1999 | ............... G06F 1/32 |
| JP | 11-003153 A | | 1/1999 | |

(Continued)

*Primary Examiner* — Edward Tso
*Assistant Examiner* — Ahmed H Omar
(74) *Attorney, Agent, or Firm* — Michael Best & Friedrich LLP

(57) ABSTRACT

A communication amount and a processing load of an external circuit of a power supply management integrated circuit are reduced.
The power supply management integrated circuit includes a state determination unit and a battery remaining quantity measurement unit. In the power supply management integrated circuit, the state determination unit determines which one of a plurality of states corresponding to different cycles a charge/discharge state of a battery falls under. Furthermore, in the power supply management integrated circuit, the battery remaining quantity measurement unit measures a battery remaining quantity of the battery each time when the cycle according to the state of charge/discharge state of the battery determined by the state determination unit elapses.

19 Claims, 22 Drawing Sheets

(51) Int. Cl.
   *G06F 1/28*     (2006.01)
   *H01M 10/48*    (2006.01)
   *G06F 1/26*     (2006.01)
   *G06F 1/3212*   (2019.01)

(52) U.S. Cl.
   CPC .............. *G06F 1/28* (2013.01); *H01M 10/48* (2013.01); *H02J 7/0048* (2020.01); *H02J 7/0068* (2013.01); *G06F 1/3212* (2013.01); *H02J 7/0049* (2020.01)

(58) Field of Classification Search
   USPC ........................................ 320/132, 134, 136
   See application file for complete search history.

(56) References Cited

FOREIGN PATENT DOCUMENTS

| | | | | |
|---|---|---|---|---|
| JP | 2000-134705 | A | 5/2000 | |
| JP | 2000-231939 | A | 8/2000 | |
| JP | 2007-240524 | A | 9/2007 | |
| JP | 2011-091940 | * | 5/2011 | ................ H02J 7/00 |
| JP | 2011-091940 | A | 5/2011 | |
| JP | 2012-147327 | A | 8/2012 | |
| JP | 2014-126406 | A | 7/2014 | |

* cited by examiner

FIG. 4

| CONTROL SIGNAL (REQUEST TO SHUT OFF POWER SUPPLY) | RECOVERY INSTRUCTION | MODE SIGNAL |
|---|---|---|
| 0 | 0 | HOLD |
| 0 | 1 | UPDATE TO ONE (NORMAL MODE) |
| 1 | 0 | UPDATE TO ZERO (SLEEP MODE) |

FIG. 5

| CHARGING SIGNAL | MODE SIGNAL | CHARGE/DISCHARGE STATE |
|---|---|---|
| 1 (CHARGE STATE) | 1 (NORMAL MODE) | CHARGE STATE |
| 1 (CHARGE STATE) | 0 (SLEEP MODE) | CHARGE STATE |
| 0 (DISCHARGE STATE) | 1 (NORMAL MODE) | DISCHARGE NORMAL MODE |
| 0 (DISCHARGE STATE) | 0 (SLEEP MODE) | DISCHARGE SLEEP MODE |

| CHARGE/DISCHARGE STATE | MEASUREMENT CYCLE |
|---|---|
| CHARGE STATE | 10ms |
| DISCHARGE NORMAL MODE | 200ms |
| DISCHARGE SLEEP MODE | $3 \times 10^5$ ms (=5 min) |

251

| CHARGE/DISCHARGE STATE | MEASUREMENT CYCLE |
|---|---|
| BATTERY REMAINING QUANTITY: 0 TO 25% | 200ms |
| BATTERY REMAINING QUANTITY: 26 TO 50% | 500ms |
| BATTERY REMAINING QUANTITY: 51 TO 75% | 1000ms |
| BATTERY REMAINING QUANTITY: 76 TO 100% | 200ms |

252

| CHARGE/DISCHARGE STATE | | MEASUREMENT CYCLE |
|---|---|---|
| CHARGE STATE | | 10ms |
| DISCHARGE NORMAL MODE | BATTERY REMAINING QUANTITY: 0 TO 25% | 200ms |
| | BATTERY REMAINING QUANTITY: 26 TO 50% | 500ms |
| | BATTERY REMAINING QUANTITY: 51 TO 75% | 1000ms |
| | BATTERY REMAINING QUANTITY: 76 TO 100% | 200ms |
| DISCHARGE SLEEP MODE | | $3 \times 10^5$ ms (=5 min) |

| CHARGE/DISCHARGE STATE | MEASUREMENT CYCLE |
|---|---|
| LOAD CURRENT: 0 TO 25% | $10^4$ms |
| LOAD CURRENT: 26 TO 50% | 1000ms |
| LOAD CURRENT: 51 TO 75% | 500ms |
| LOAD CURRENT: 76 TO 100% | 200ms |

POWER SUPPLY MANAGEMENT INTEGRATED CIRCUIT, ELECTRONIC DEVICE, AND CONTROL METHOD OF POWER SUPPLY MANAGEMENT INTEGRATED CIRCUIT

TECHNICAL FIELD

The present technology relates to a power supply management integrated circuit, an electronic device, and a control method of a power supply management integrated circuit. More particularly, the present technology relates to a power supply management integrated circuit connected to a battery, an electronic device, and a control method of a power supply management integrated circuit.

BACKGROUND ART

Conventionally, in an electronic device to which a battery is mounted, a battery remaining quantity is periodically measured to display the battery remaining quantity and the like. For example, a structure has been proposed in which an electronic device including a Central Processing Unit (CPU) and a Power Management IC (PMIC) periodically measures a battery remaining quantity from a terminal voltage of a battery (for example, refer to Patent Document 1). In this device, the CPU instructs the PMIC to transmit the terminal voltage when the battery remaining quantity is measured, and the PMIC reads the terminal voltage from a voltmeter and the like according to the instruction and transmits the read voltage to the CPU. Then, the CPU measures the battery remaining quantity from the terminal voltage read by the PMIC.

CITATION LIST

Patent Document

Patent Document 1: Japanese Patent Application Laid-Open No. 2014-126406

SUMMARY OF THE INVENTION

Problems to be Solved by the Invention

However, in the related art described above, each time when the battery remaining quantity is measured, the CPU needs to transmit a signal instructing to read the terminal voltage to the power supply management integrated circuit (PMIC), and the PMIC needs to transmit the terminal voltage to the CPU. Therefore, as the measurement cycle is shorter, an amount of communication between the PMIC and the CPU may increase. In addition, a processing load of the CPU increases for processing regarding measurement of the battery remaining quantity. Thus, there is a problem in that the communication amount and the processing load of the external circuit of the PMIC increase.

The present technology has been made in view of such a situation. A purpose of the present technology is to reduce a communication amount and a processing load of an external circuit of a power supply management integrated circuit.

Solutions to Problems

The present technology has been made to solve the above problems. A first aspect of the present technology is a power supply management integrated circuit including a state determination unit which determines which one of a plurality of states corresponding to different cycles a charge/discharge state of a battery falls under and a battery remaining quantity measurement unit which measures a battery remaining quantity of the battery each time when the cycle corresponding to the determined state elapses, and a control method thereof. This causes an effect such that the battery remaining quantity is measured each time when the measurement cycle corresponding to the charge/discharge state of the battery elapses.

Furthermore, in the first aspect, the plurality of states includes a plurality of discharge states having different discharge rates, and the cycle may be shorter as the discharge rate is faster. This causes an effect such that the battery remaining quantity is measured each time when the cycle which is shorter as the discharge rate is faster elapses.

Furthermore, in the first aspect, each of the plurality of discharge states has a different range of the battery remaining quantity, and the state determination unit may determine the charge/discharge state on the basis of the measured battery remaining quantity. This causes an effect such that the battery remaining quantity is measured each time when the measurement cycle corresponding to the range of the battery remaining quantity of the battery elapses.

Furthermore, in the first aspect, an ammeter for measuring a load current of a load connected to the battery is further included. Each of the plurality of discharge states has a different range of the load current, and the state determination unit may determine the charge/discharge state on the basis of the measured load current. This causes an effect such that the battery remaining quantity is measured each time when the measurement cycle corresponding to the range of the load current elapses.

Furthermore, in the first aspect, a power supply control unit, is further included which controls power consumption according to an instruction to shift a state to either one of a normal state where the power consumption of an electronic device including the battery exceeds predetermined power and a power saving state where the power consumption exceeds the predetermined power. The plurality of discharge states includes the normal state and the power saving state, and the state determination unit may determine the charge/discharge state on the basis of the controlled power consumption. This causes an effect such that the battery remaining quantity is measured each time when the measurement cycle corresponding to the power consumption elapses.

Furthermore, in the first aspect, the plurality of states includes a charge state and a discharge state, and the cycle corresponding to the charge state may be shorter than the cycle corresponding to the discharge state. This causes an effect such that the battery remaining quantity is measured each time when the cycle shorter than that in the discharge state elapses in the charge state.

Furthermore, in the first aspect, a charger for charging the battery is further included, and the state determination unit may determine the charge/discharge state on the basis of whether the charger charges the battery. This causes an effect such that the charge/discharge state is determined according to whether the charging is performed.

Furthermore, in the first aspect, a holding unit for holding the cycle in association with each of the plurality of states is further included, and the battery remaining quantity measurement unit may acquire the cycle corresponding to the determined state from the holding unit. This causes an effect such that the battery remaining quantity is measured each time when the cycle acquired from the holding unit elapses.

Furthermore, a second aspect of the present technology is an electronic device including a battery and a power supply management integrated circuit including a state determination unit which determines which one of a plurality of states corresponding to different cycles a charge/discharge state of the battery falls under and a battery remaining quantity measurement unit which measures a battery remaining quantity of the battery each time when the cycle corresponding to the determined state elapses. This causes an effect such that the battery remaining quantity is measured each time when the measurement cycle corresponding to the charge/discharge state of the battery elapses.

Effects of the Invention

According to the present technology, an excellent effect can be obtained such that a communication amount and a processing load of an external circuit of a power supply management integrated circuit can be reduced. Note that the effects described herein are not necessarily limited and that the effect may be any effects described in the present disclosure.

BRIEF DESCRIPTION OF DRAWINGS

FIG. 4 is a diagram to describe an operation of a power supply control unit according to the first embodiment of the present technology.

FIG. 5 is a diagram to describe an operation of a state determination unit according to the first embodiment of the present technology.

FIG. 8 is a diagram of exemplary measurement cycles for respective states according to the first embodiment of the present technology.

FIG. 24 is a diagram of exemplary measurement cycles for respective states according to the third embodiment of the present technology.

MODE FOR CARRYING OUT THE INVENTION

Embodiments for carrying out the present technology (referred to as embodiment below) are described below. The description is made in the following order.
1. First embodiment (example in which battery remaining quantity is measured at cycle corresponding to charge/discharge state)
2. Second embodiment (example in which battery remaining quantity is measured at cycle corresponding to any one of a plurality of charge/discharge states with different battery remaining quantities)
3. Third embodiment (example in which battery remaining quantity is measured at cycle corresponding to any one of a plurality of charge/discharge states with different load currents)

1. First Embodiment

<Exemplary Configuration of Electronic Device>

Figure 1:
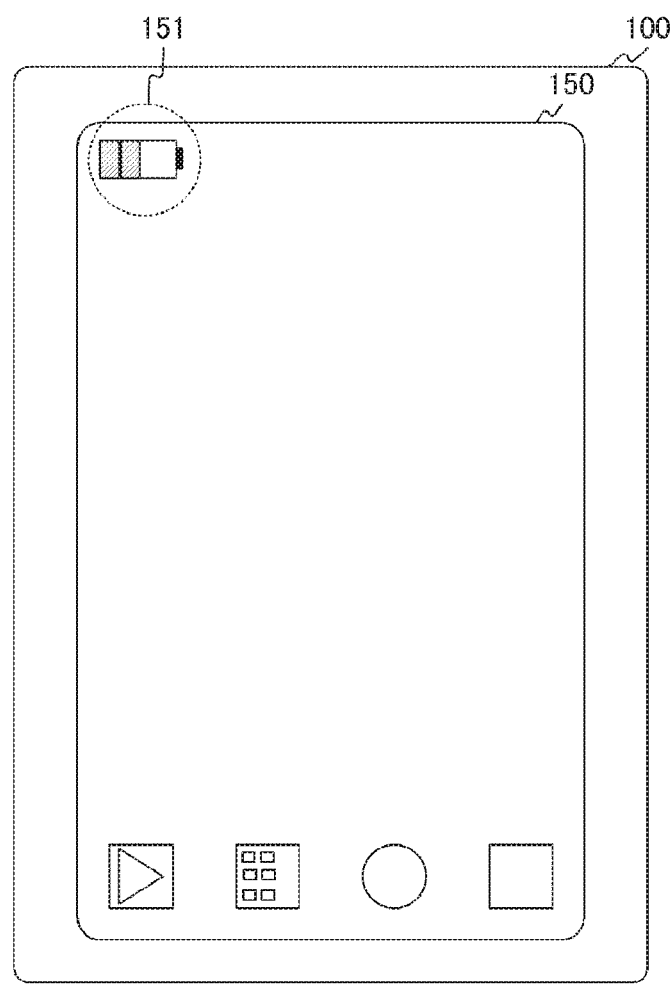
FIG. 1 is an exemplary external view of an electronic device according to a first embodiment of the present technology.

FIG. 1 is an exemplary external view of an electronic device 100 according to a first embodiment of the present technology. As the electronic device 100, a mobile terminal (such as smartphone and smart watch) having a battery mounted thereon is assumed. The electronic device 100 includes a display 150. On the display 150, an icon 151 and the like indicating a battery remaining quantity are displayed.

Figure 2:
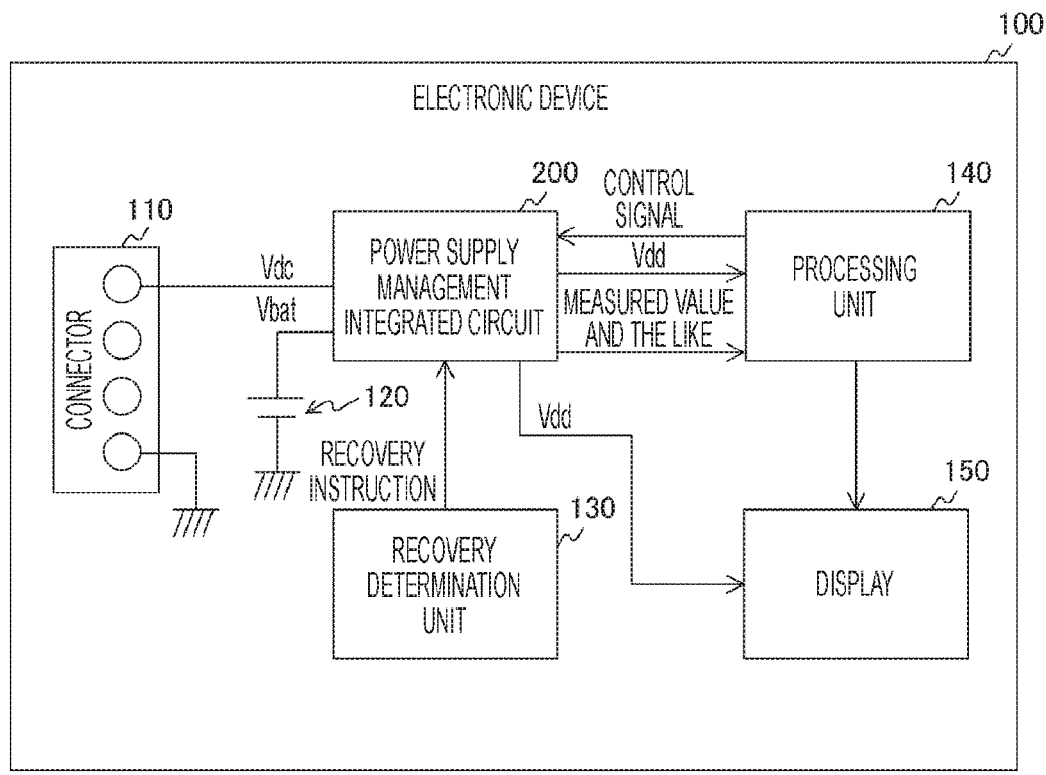
FIG. 2 is a block diagram of an exemplary configuration of the electronic device according to the first embodiment of the present technology.

FIG. 2 is a block diagram of an exemplary configuration of the electronic device 100 according to the first embodiment. The electronic device 100 includes a connector 110, a secondary battery 120, a power supply management integrated circuit 200, a recovery determination unit 130, a processing unit 140, and the display 150.

The connector 110 is a component for connecting cables. As the connector 110, for example, a connector conforming to the universal Serial Bus (USB) standard is used. When a power supply device is attached to the connector 110 via the cable, a predetermined supply voltage Vdc is supplied from the connector 110 to the power supply management integrated circuit 200.

The secondary battery 120 stores electric energy by being charged. Furthermore, instead of the secondary battery 120, a primary battery that cannot be charged may be provided. In addition, the secondary battery 120 is an example of a battery described in the claims.

The power supply management integrated circuit 200 manages power supply to the processing unit 140 and the display 150. When the power supply device is attached to the connector 110, the power supply management integrated circuit 200 charges the secondary battery 120 using the supply voltage Vdc from the power supply device. Furthermore, the power supply management integrated circuit 200 notifies the processing unit 140 whether charging is in progress.

Furthermore, the power supply management integrated circuit 200 converts a terminal voltage Vbat of the secondary battery 120 and supplies the converted terminal voltage Vbat to the processing unit 140 and the display 150. Then, the power supply management integrated circuit 200 controls a voltage to be supplied to each circuit of the processing unit 140 and the like according to control of the processing unit 140.

In addition, the power supply management integrated circuit 200 measures a battery remaining quantity of the secondary battery 120 each time when a certain measurement cycle elapses and supplies a measured value to the processing unit 140, Here, the power supply management integrated circuit 200 holds a measurement cycle corresponding to each charge/discharge state of the secondary battery 120 in advance and uses a measurement cycle corresponding to the current state for the measurement.

The processing unit 140 performs predetermined processing by using the measured value of the battery remaining quantity. As the processing unit 140, a CPU, an application processor, or a system controller or the like is assumed. For example, the processing unit 140 controls the display 150 to display the icon 151 indicating the battery remaining quantity. Furthermore, the processing unit 140 makes the display 150 display an icon indicating that charging is in progress during charging.

Note that the processing unit 140 uses the measured value of the battery remaining quantity for display processing of the battery remaining quantity. However, the measured value of the battery remaining quantity may be used for other processing. For example, the processing unit 140 can use the measured value of the battery remaining quantity for processing of estimating a remaining operation time of the electronic device 100 and processing of displaying the operation time.

Furthermore, the processing unit 140 determines whether to shift a mode from a normal mode to a sleep mode. Here, the sleep mode is a mode in which power consumption of the electronic device 100 is reduced to equal to or lower than a predetermined power by shutting off the power supply to the processing unit 140 and the like. On the other hand, the normal mode is a mode in which the power consumption of the electronic device 100 exceeds the predetermined power. For example, in a case where a user performs a predetermined operation or in a case where the user's operation is not performed for a fixed time, the mode of the electronic device 100 shifts to the sleep mode. The processing unit 140 requests the power supply management integrated circuit 200 to shut off the power supply immediately before the mode shifts to the sleep mode. In response to the request, the power supply management integrated circuit 200 shuts off the power supply to the processing unit 140 and the display 150, and the mode of the electronic device 100 shifts to the sleep mode.

The recovery determination unit 130 determines whether the sleep mode shifts (recovered) to the normal mode. For example, in a case where an acceleration measured by an acceleration sensor provided in the electronic device 100 has exceeded a certain value or in a case where the user has performed a predetermined operation, the mode of the electronic device 100 is recovered to the normal mode. The recovery determination unit 130 supplies a recovery instruction to the power supply management integrated circuit 200 when recovering the mode. In accordance with the recovery instruction, the power supply management integrated circuit 200 restarts power supply to the processing unit 140 and the display 150, and the mode of the electronic device 100 shifts to the normal mode.

According to the control of the processing unit 140, the display 150 displays an icon indicating the battery remaining quantity and the like.

[Exemplary Configuration of Power Supply Management Integrated Circuit]

Figure 3:
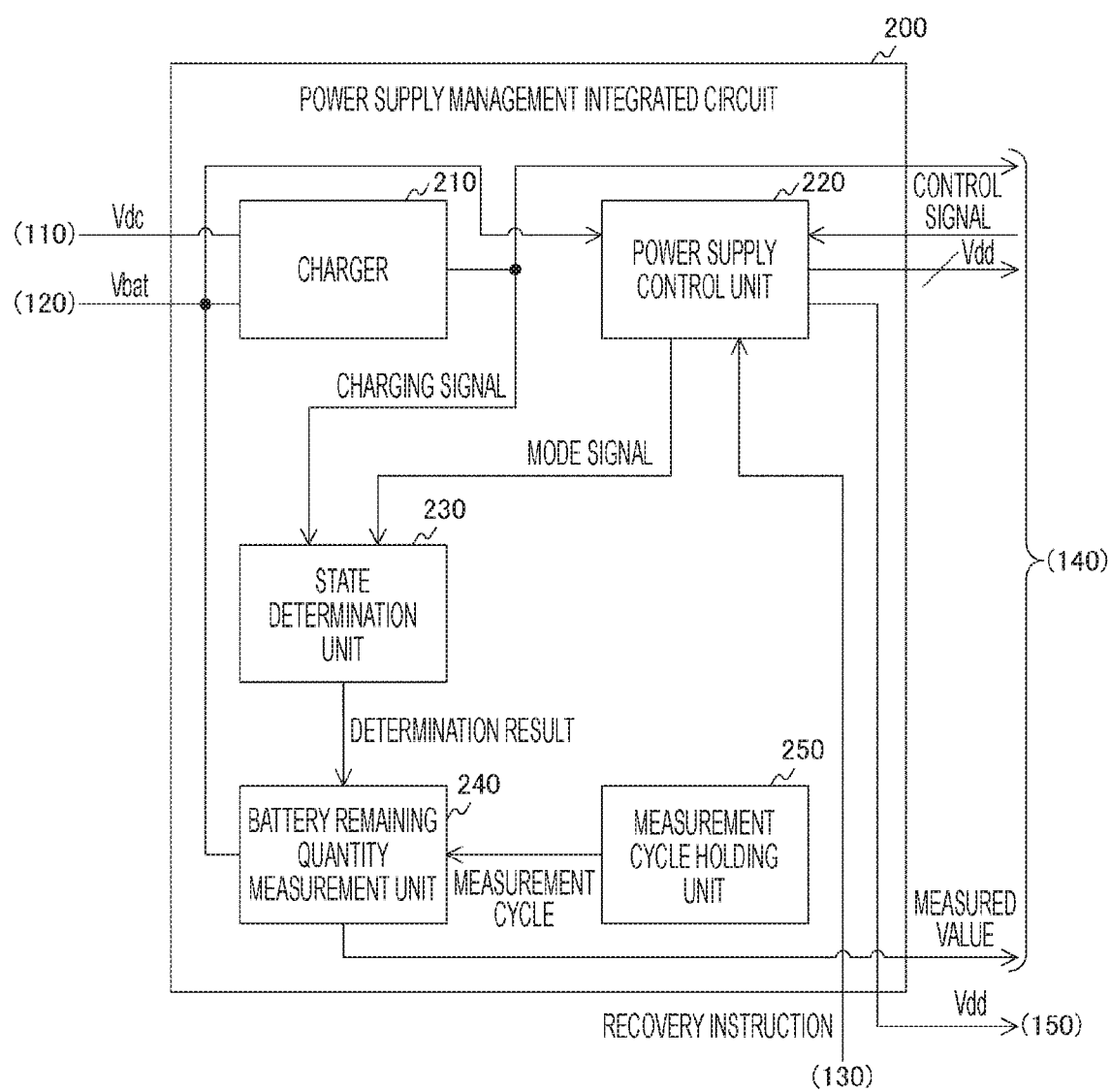
FIG. 3 is a block diagram of an exemplary configuration of a power supply management integrated circuit according to the first embodiment of the present technology.

FIG. 3 is a block diagram of an exemplary configuration of the power supply management integrated circuit 200 according to the first embodiment. The power supply management integrated circuit 200 includes a charger 210, a power supply control unit 220, a state determination unit 230, a battery remaining quantity measurement unit 240, and a measurement cycle holding unit 250.

The charger 210 charges the secondary battery 120. The charger 210 detects whether the power supply device is attached to the connector 110. When detecting the attachment of the power supply device, the charger 210 starts to charge the secondary battery 120 by using power supply from the power supply device. Then, in a case where the power supply device is detached or in a case where the charging of the secondary battery 120 has been completed, the charger 210 terminates the charging of the secondary battery 120. Furthermore, the charger 210 supplies a charging signal which notifies whether the charging is in progress to the processing unit 140 and the state determination unit 230.

Note that in a case where the primary battery is provided instead of the secondary battery 120, it is not necessary to provide the charger 210. Furthermore, the structure in which the charger 210 is provided in the power supply management integrated circuit 200 is used. However, the charger 210 may be provided outside the power supply management integrated circuit 200.

The power supply control unit 220 controls power supply to be supplied to the processing unit 140, the display 150, and the like. The power supply control unit 220 receives a control signal from the processing unit 140. The control signal includes, for example, a value of a voltage to be supplied to the processing unit 140 and a request to shut off the power supply to the processing unit 140. The power supply control unit 220 supplies power to the processing unit 140 and the like according to the control signal by using the electric energy stored in the secondary battery 120. For example, the power supply control unit 220 converts the terminal voltage Vbat of the secondary battery 120 into a voltage indicated by the control signal and supplies the converted voltage to the processing unit 140.

Furthermore, the power supply control unit 220 shuts off the power supply to the processing unit 140 and the like when a shutdown of the power supply is requested by the control signal. As a result, the mode of the electronic device 100 shifts to the sleep mode. When receiving the recovery instruction from the recovery determination unit 130 in the sleep mode, the power supply control unit 220 restarts the power supply to the processing unit 140 and the like. With this processing, the mode of the electronic device 100 is recovered to the normal mode. Furthermore, the power supply control unit 220 generates a mode signal indicating whether the current mode is the sleep mode and supplies the mode signal to the state determination unit 230.

Note that the power supply control unit 220 shuts off the power supply to the circuits other than the power supply management integrated circuit 200 in the sleep mode. However, the structure is not limited to this. For example, the power supply control unit 220 may reduce the power supply to the processing unit 140, the display 150, and the like without shutting off the power supply in the sleep mode. Furthermore, in the sleep mode, the power supply to the processing unit 140 may be shut off to reduce the power to the display 150.

The state determination unit 230 determines which one of the plurality of states the charge/discharge state of the secondary battery 120 falls under on the basis of the charging signal and the mode signal. The charge/discharge state is classified, for example, into a "charge state" in which the secondary battery 120 is charged and a "discharge state" in which the secondary battery 120 is discharged. Furthermore, the discharge state is classified into a plurality of states having different discharge rates. For example, the discharge state is classified into a "discharge normal mode" and a "discharge sleep mode". The "discharge normal mode" is a state in the discharge state and the normal mode. The "discharge sleep mode" is a state in the discharge state and the sleep mode. The state determination unit 230 supplies the determination result regarding the state to the battery remaining quantity measurement unit 240.

The measurement cycle holding unit 250 holds the measurement cycle in association with each of the charge/discharge states. Note that the measurement cycle holding unit 250 is an example of a holding unit described in the claims.

The battery remaining quantity measurement unit 240 periodically measures the battery remaining quantity of the secondary battery 120. The battery remaining quantity measurement unit 240 receives the determination result from the state determination unit 230. Then, the battery remaining quantity measurement unit 240 reads the measurement cycle corresponding to the state indicated by the determination result from the measurement cycle holding unit 250 and measures the battery remaining quantity of the secondary battery 120 each time when the measurement cycle elapses. Then, the battery remaining quantity measurement unit 240 supplies the measured value to the processing unit 140.

FIG. 4 is a diagram to describe an operation of the power supply control unit 220 according to the first embodiment. In the request to shut off the power supply in the control signal, "1" is set when the power supply to the processing unit 140 and the like is shut off, and "0" is set otherwise. Furthermore, in the recovery instruction, "1" is set when the mode is recovered from the sleep mode, and "0" is set otherwise. Furthermore, it is assumed that an initial value of the mode signal be "1" (normal mode). Note that it is assumed that "1" is not simultaneously set to the request to shut off the power supply and the recovery instruction.

In a case where the request to shut off the power supply is set to "1" and the recovery instruction is set to "0", the power supply control unit 220 updates the mode signal to "0" (sleep mode). Furthermore, in a case where the request to shut off the power supply is set to "0" and the recovery instruction is set to "1", the power supply control unit 220 updates the mode signal to "1" (normal mode). In a case where both the request to shut off the power supply and the recovery instruction are set to "0", the value of the mode signal is held.

FIG. 5 is a diagram to describe an operation of the state determination unit 230 according to the first embodiment. It is assumed that, in the charging signal, "1" be set in the charge state and "0" be set in the discharge state. In a case where the charging signal is set to "1" (charge state), regardless of the value of the mode signal, the state determination unit 230 determines that the charge/discharge state is the "charge state".

Furthermore, in a case where the charging signal is set to "0" (discharge state) and the mode signal is set to "1" (normal mode), the state determination unit 230 determines that the charge/discharge state is the "discharge normal mode". In a case where the charging signal is set to "0" (discharge state) and the mode signal is set to "0" (sleep mode), the state determination unit 230 determines that the charge/discharge state is the "discharge sleep mode".

Note that the charger 210 notifies whether the charging is performed by a one-bit charging signal. However, it is possible to transmit a charging start signal at the time of starting the charging and transmit a charging terminate signal at the time of terminating the charging without using the charging signal.

In addition, the charge/discharge states are classified into three kinds of states. However, regardless of whether the mode is the sleep mode, the charge/discharge states may be classified into two kinds of states, i.e., the "charge state" and the "discharge state". Furthermore, regardless of whether the battery is charged, the charge/discharge state may be classified into two kinds of states, i.e., the "normal mode" and the "sleep mode".

Figure 6:
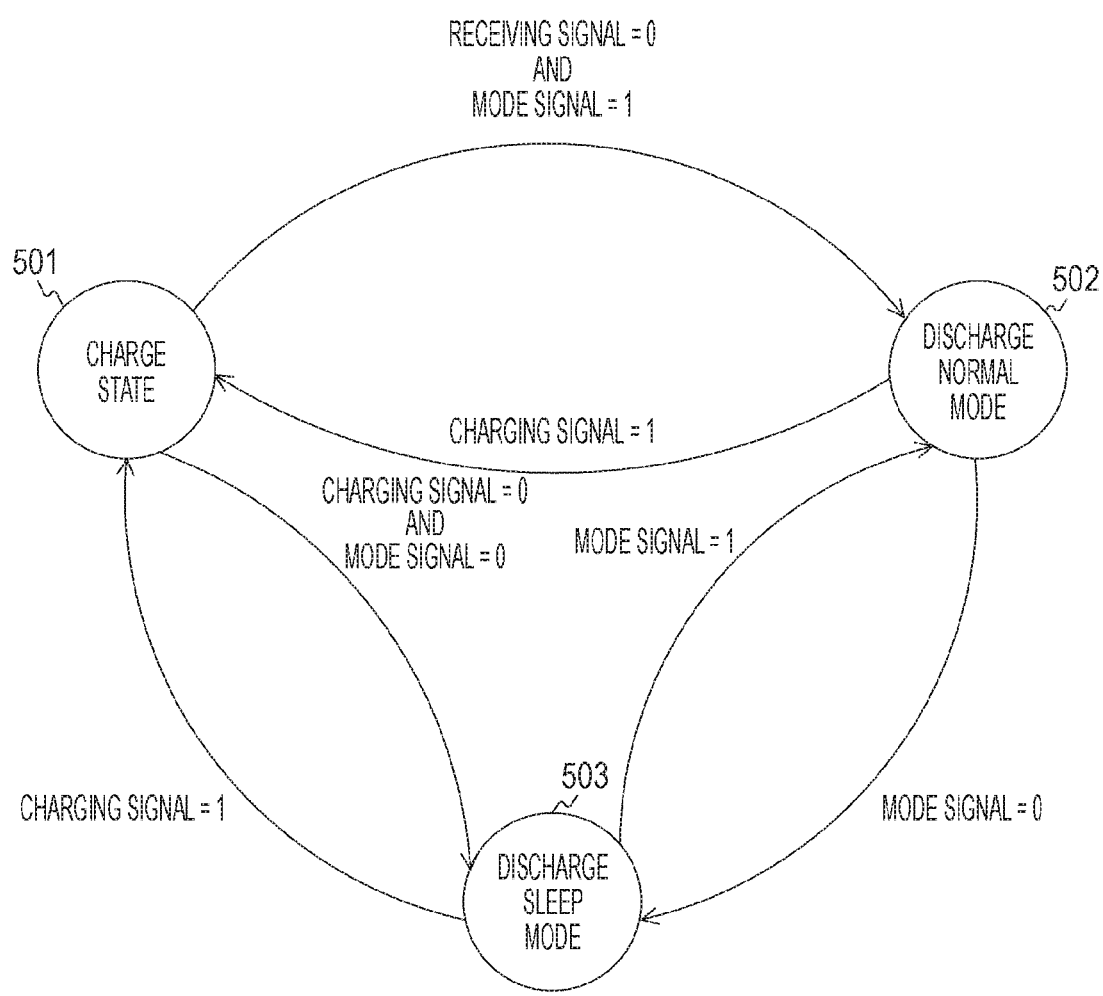
FIG. 6 is a diagram of an exemplary state transition diagram of the electronic device according to the first embodiment of the present technology.

FIG. 6 is a diagram of an exemplary state transition diagram of the electronic device 100 according to the first embodiment. The charge/discharge state of the secondary battery 120 shifts to any one of a charging state 501, a state 502 in the discharge normal mode, and a state 503 in the discharge sleep mode. An initial state is, for example, the state 502 (discharge normal mode).

In the state 502 (discharge normal mode), when "0" is set to the mode signal by the request to shut off the power supply, the charge/discharge state shifts to the state 503 (discharge sleep mode). Furthermore, when "1" is set to the charging signal by attaching the power supply device, the charge/discharge state shifts to the state 501 (charge state).

In a case where "0" is set to the charging signal by detaching the power supply device and "0" is set to the mode signal in the state 501 (charge state), the charge/discharge state shifts to the state 503 (discharge sleep mode). Furthermore, in a case where "0" is set to the charging signal and "1" is set to the mode signal, the charge/discharge state shifts to the state 502 (discharge normal mode).

When "1" is set to the mode signal by the recovery instruction in the state 503 (discharge sleep mode), the charge/discharge state shifts to the state 502 (discharge normal mode). Furthermore, when "1" is set to the charging signal by attaching the power supply device, the charge/discharge state shifts to the state 501 (charge state).

[Exemplary Configuration of Battery Remaining Quantity Measurement Unit]

Figure 7:
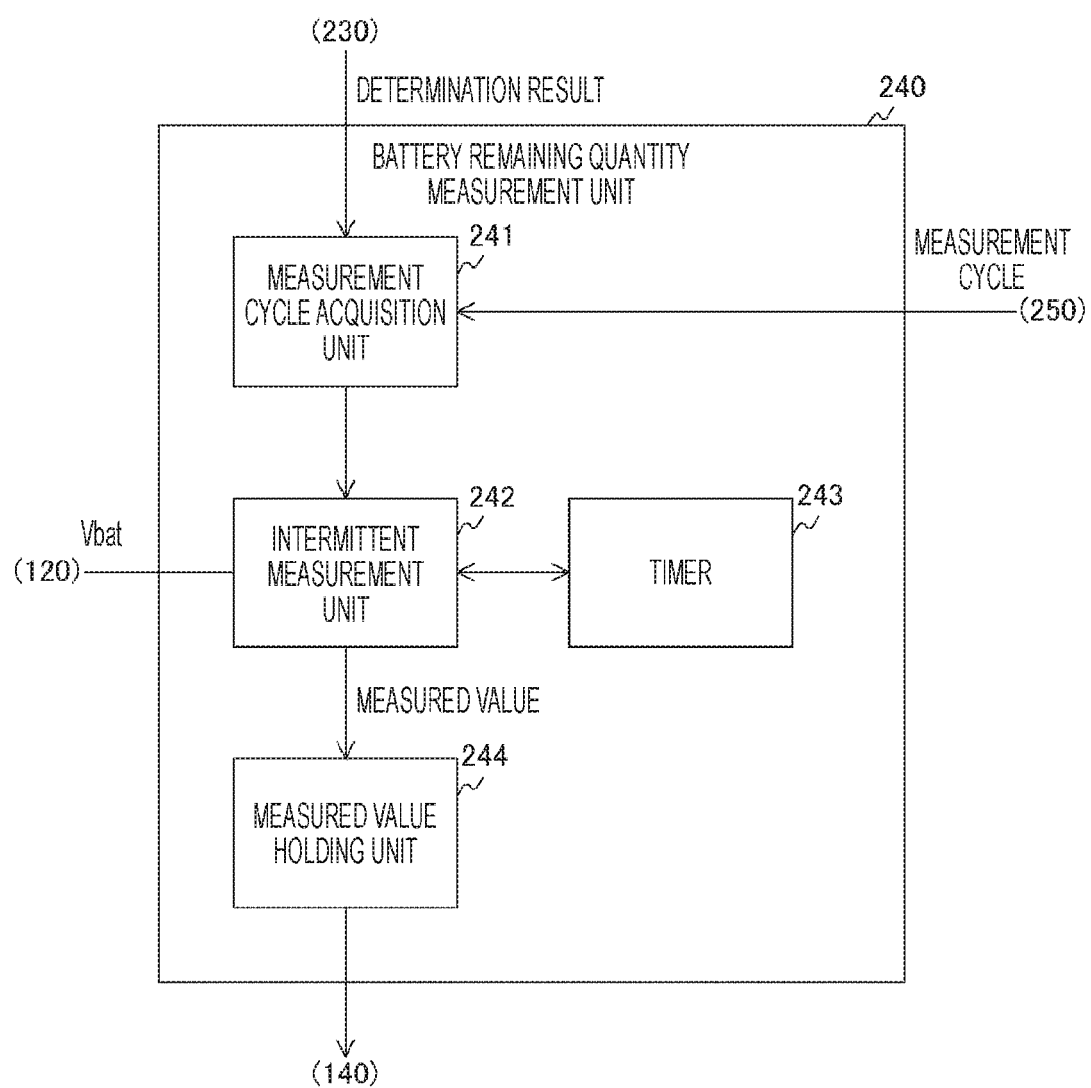
FIG. 7 is a block diagram of an exemplary configuration of a battery remaining quantity measurement unit according to the first embodiment of the present technology.

FIG. 7 is a block diagram of an exemplary configuration of the battery remaining quantity measurement unit 240 according to the first embodiment. The battery remaining quantity measurement unit 240 includes a measurement cycle acquisition unit 241, an intermittent measurement unit 242, a timer 243, and a measured value holding unit 244.

The measurement cycle acquisition unit 241 reads a measurement cycle corresponding to a state indicated by the determination result from the measurement cycle holding unit 250. The measurement cycle acquisition unit 241 supplies the read measurement cycle to the intermittent measurement unit 242.

The intermittent measurement unit 242 measures the battery remaining quantity of the secondary battery 120 each time when the measurement cycle from the measurement cycle acquisition unit 241 elapses. The intermittent measurement unit 242 controls the timer 243 to measure the time, and measures the battery remaining quantity each time when the measurement cycle is measured. In general, a terminal voltage of a battery is the highest immediately after completion of charging and decreases along with the progress of discharge. Therefore, the intermittent measurement unit 242 acquires the terminal voltage Vbat of the secondary battery 120 with a voltmeter and the like, and acquires a smaller value as the measured value of the battery remaining quantity as the voltage is lower. The intermittent measurement unit 242 makes the measured value holding unit 244 hold the measured value of the battery remaining quantity.

Note that the intermittent measurement unit 242 measures the battery remaining quantity from the terminal voltage Vbat. However, the battery remaining quantity may be measured by using the other measuring method. For example, it is possible that the intermittent measurement unit 242 may calculate the remaining quantity by integrating an amount of a current stored at the time of charging by using a current detection resistor and obtaining an amount of a current that flows out at the time of discharge. This method is called as a coulomb counter method. Furthermore, in a case where the discharge characteristics are different depending on the temperature, the intermittent measurement unit 242 may obtain the battery remaining quantity by additionally measuring the temperature and using a combination of the temperature and the coulomb counter method. Furthermore, in general, when the secondary battery is repeatedly charged and discharged, a battery capacity decreases (deteriorate), and the discharge characteristics change. Therefore, it is possible that the charger 210 counts the number of charge/discharge and the intermittent measurement unit 242 obtains the battery remaining quantity from the number of charge/discharge, the terminal voltage and the like.

The timer 243 measures the time according to the control of the intermittent measurement unit 242. The measured value holding unit 244 holds the measured value of the battery remaining quantity. The measured value held by the measured value holding unit 244 is read by the processing unit 140.

FIG. 8 is a diagram of exemplary measurement cycles for respective states according to the first embodiment. In the measurement of the battery remaining quantity, the battery remaining quantity measurement unit 240 needs to operate a circuit such as a voltmeter and an ammeter, and accordingly, consumes a small amount of electric power every measurement. Therefore, the longer the measurement cycle is, the more a reduction rate of the battery remaining quantity of the secondary battery 120 can be lowered.

During the charging, a reduced battery remaining quantity used by the measurement can be sufficiently compensated. Therefore, the measurement cycle holding-unit 250 holds a measurement cycle shorter than that in the discharge state ("discharge normal mode" and "discharge sleep mode") in association with the "charge state". Furthermore, in the sleep mode, since the power consumption is less than that in the normal mode and the discharge rate is low, there is little necessity to shorten the measurement cycle. In addition, the sleep mode is used to reduce power consumption of a battery and to increase an operation time of a device. Therefore, if the measurement cycle shortened, the reduction rate of the battery remaining quantity gets faster. The result contrary to the purpose is made. Therefore, the measurement cycle longer than that in the "discharge normal mode" is held in association with the "discharge sleep mode".

For example, a measurement cycle of 10 milliseconds (ms) is held in association with the "charge state". In addition, a measurement cycle of 200 milliseconds (ms) is held in association with the "discharge normal mode", and a measurement cycle of $3\times10^5$ milliseconds (ms), that is, five minutes is held in association with the "discharge sleep mode".

Note that the charge state may be further classified into a plurality of states having different charge rates. For example, the charge states may be classified into a "charge sleep mode" which is the charge state and the sleep mode and a "charge normal mode" which is the charge state and the normal mode. In this case, a measurement cycle longer than the "charge sleep mode" is held in association with the "charge normal mode" in which the charge rate is slow.

[Exemplary Configuration of Power Supply Control Unit]

Figure 9:
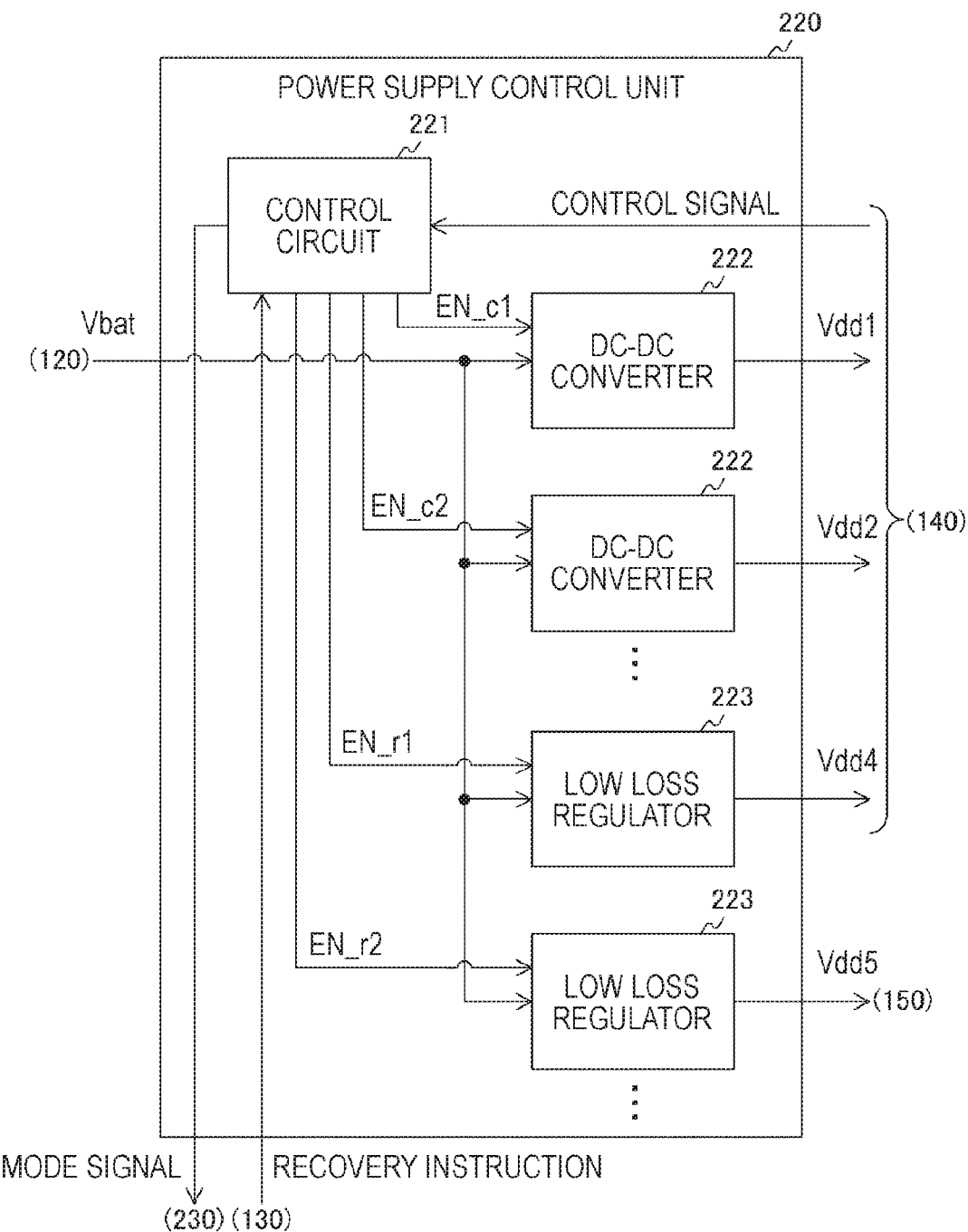
FIG. 9 is a block diagram of an exemplary configuration of the power supply control unit according to the first embodiment of the present technology.

FIG. 9 is a block diagram of an exemplary configuration of the power supply control unit 220 according to the first embodiment. The power supply control unit 220 includes a control circuit 221, a plurality of Direct Current (DC)-DC converters 222, and a plurality of low loss regulators 223.

The DC-DC converter 222 converts the DC terminal voltage Vbat into a DC voltage different from the DC terminal voltage and outputs the converted DC voltage. It is assumed that the output voltages of the respective DC-DC converters 222 be different from each other.

The low loss regulator 223 converts the terminal voltage Vbat into a constant DC voltage. The respective low loss regulators 223 supply voltages to different circuits (processing unit 140, display 150, and the like).

The control circuit 221 controls the DC-DC converters 222 and the low loss regulators 223. The control circuit 221 can individually operate or stop the DC-DC converters 222 and the low loss regulators 223 with enable signals. When receiving a control signal instructing the value of the voltage from the processing unit 140, the control circuit 221 operates the DC-DC converter 222 or the low loss regulator 223 corresponding to the voltage with the enable signals.

Furthermore, when receiving a control signal to request to shut off the power supply from the processing unit 140, the control circuit 221 stopes all the DC-DC converters 222 and all the low loss regulators 223 with the enable signals. Then, when receiving the recovery instruction from the recovery determination unit 130, the control circuit 221 operates all the DC-DC converters 222 and all the low loss regulators 223 with the enable signals.

Furthermore, the control circuit 221 generates a mode signal from the control signal and the recovery instruction and supplies the mode signal to the state determination unit 230.

[Exemplary Operation of Electronic Device]

Figure 10:
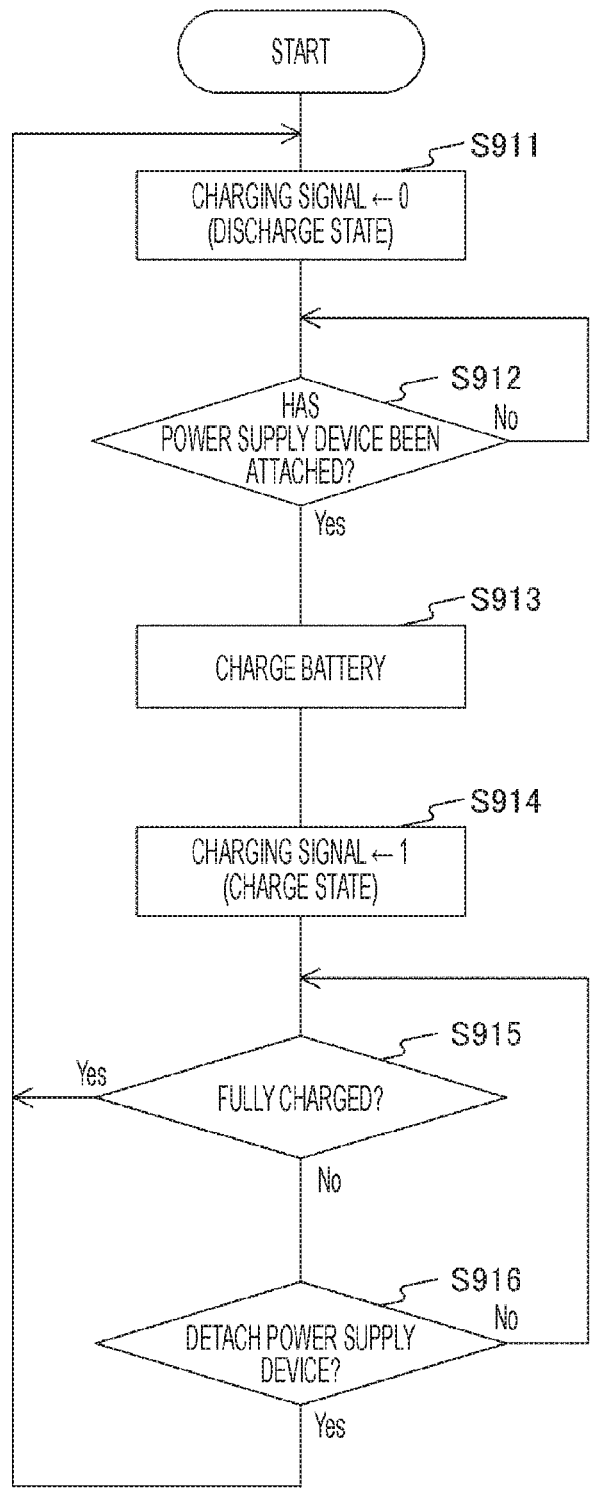
FIG. 10 is a flowchart of an exemplary operation of a charger according to the first embodiment of the present technology.

FIG. 10 is a flowchart of an exemplary operation of the charger 210 according to the first embodiment. This operation is started, for example, when the electronic device 100 is turned on.

The charger 210 sets "0" (during discharging) to the charging signal (step S911). Then, the charger 210 determines whether the power supply device has been attached (step S912). In a case where the power supply-device is not attached (step S912: No), the charger 210 repeats step S912.

On the other hand, in a case where the power supply device has been attached (step S912: Yes), the charger 210 charges the secondary battery 120 (step S913), and sets "1" to the charging signal (step S914). Then, the charger 210 determines whether the secondary battery 120 is fully charged (step S915). In a case where the secondary battery 120 is not fully charged (step S915: No), the charger 210 determines whether the power supply device has been detached (step S916).

In a case where the power supply device is attached (step S916: No), the charger 210 repeats processing in step S915 and subsequent processing. In a case where the secondary battery 120 is fully charged (step S915: Yes) or in a case where the power supply device is detached (step S916: Yes), the charger 210 repeats processing in step S911 and subsequent processing.

Figure 11:
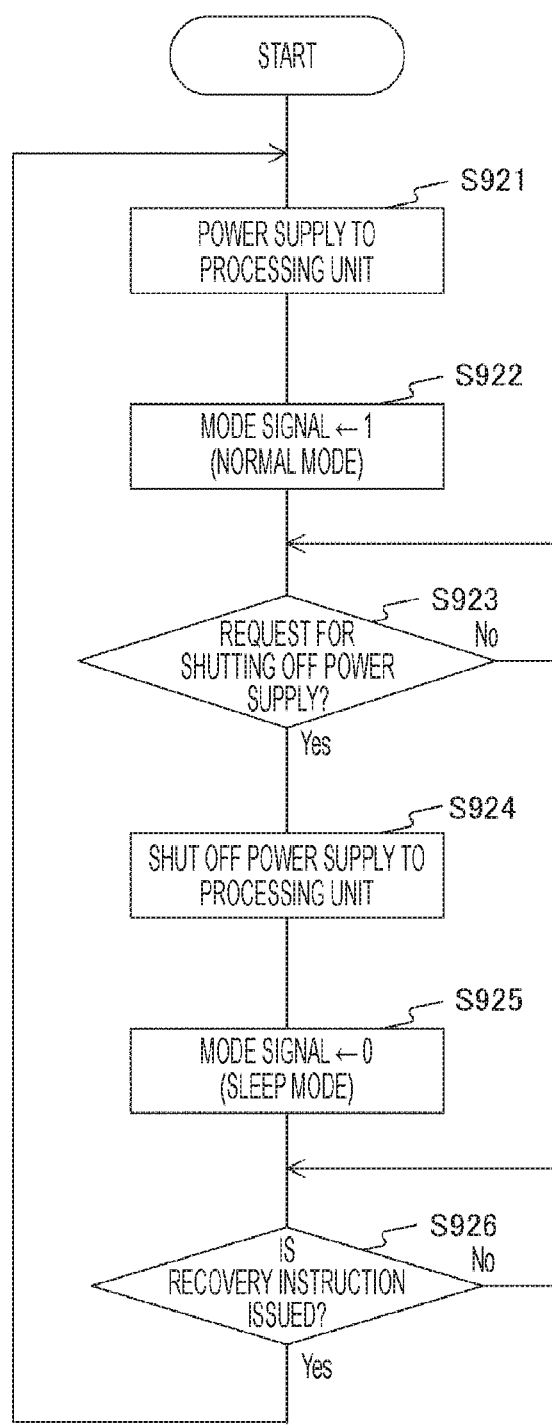
FIG. 11 is a flowchart of an exemplary operation of the power supply control unit according to the first embodiment of the present technology.

FIG. 11 is a flowchart of an exemplary operation of the power supply control unit 220 according to the first embodiment. This operation is started, for example, when the electronic device 100 is turned on.

The power supply control unit 220 supplies the power from the secondary battery 120 to the processing unit 140 and the like (step S921), and sets "1" (normal mode) to the mode signal (step S922). Then, the power supply control unit 220 determines whether the shut-off of the power supply has been requested from the processing unit 140 (step S923). In a case where the shut-off of the power supply is not requested (step S923: No), the power supply control unit 220 repeats step S923.

On the other hand, in a case where the shut-off of the power supply has been requested (step S923: Yes), the power supply control unit 220 shuts off the power supply to the processing unit 140 and the like (step S924), and sets "0" (sleep mode) to the mode signal (step S925). Then, the power supply control unit 220 determines whether the recovery has been instructed by the recovery determination unit 130 (step S926). In a case where the recovery is not instructed (step S926: No), the power supply control unit 220 repeats step S926. On the other hand, in a case where the recovery has been instructed (step S926: Yes), the power supply control unit 220 repeatedly performs processing in step S921 and subsequent processing.

Figure 12:
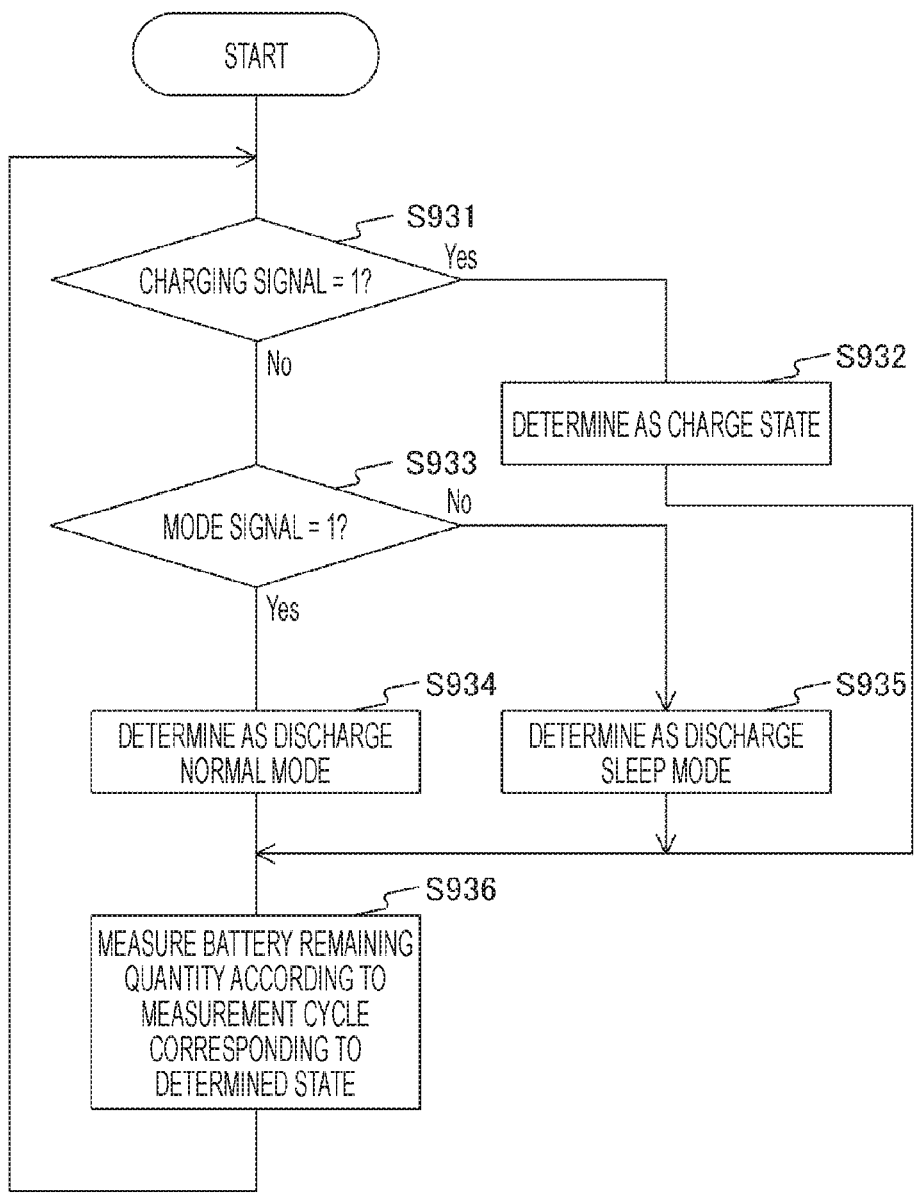
FIG. 12 is a flowchart of exemplary operations of the state determination unit and the battery remaining quantity measurement unit according to the first embodiment of the present technology.

FIG. 12 is a flowchart of exemplary operations of the state determination unit 230 and the battery remaining quantity measurement unit 240 according to the first embodiment. This operation is started, for example, when the electronic device 100 is turned on.

The state determination unit 230 determines whether the charging signal is "1" (during charging) (step S931). In a case where the charging signal is "1" (step S931: Yes), the state determination unit 230 determines that the charge/discharge state is the charge state (step S932).

On the other hand, in a case where the charging signal is "0" (during discharging) (step S931: No), the state determination unit 230 determines whether the mode signal is "1" (normal mode) (step S933). In a case where the mode signal is "1" (step S933: Yes), the state determination unit 230 determines that the charge/discharge state is the discharge normal mode (step S934). On the other hand, in a case where the mode signal is "0" (sleep mode) (step S933: No), the state determination unit 230 determines that the charge/discharge state is the discharge sleep mode (step S935).

After step S932, S934, or S935, the battery remaining quantity measurement unit 240 measures the battery remaining quantity according to the measurement cycle corresponding to the determined state (step S936). After step S936, the state determination unit 230 repeats step S931 and the subsequent steps.

Figure 13:
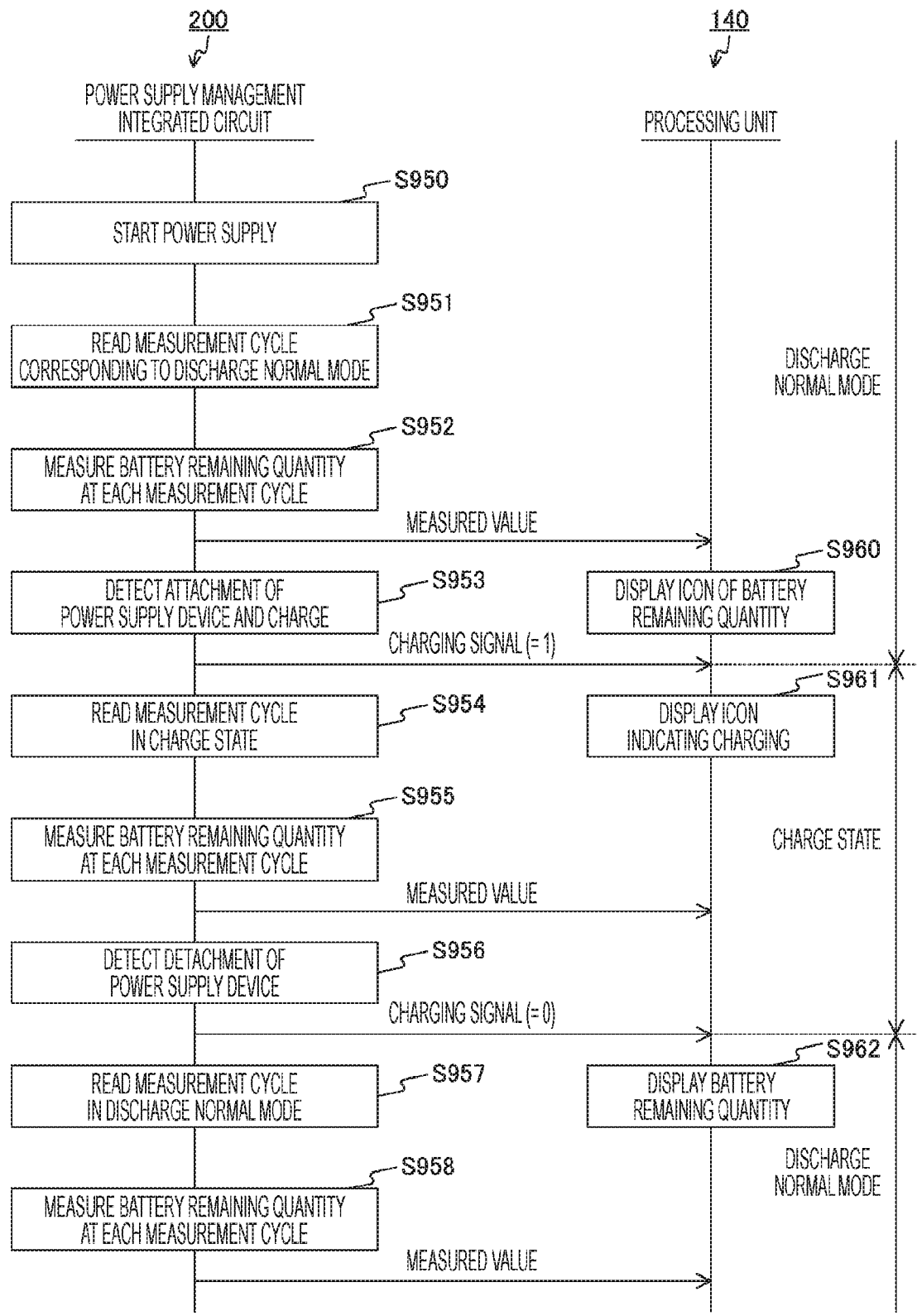
FIG. 13 is an exemplary sequence diagram at the time of transition from one of a discharge normal mode and a charge state to the other state in the first embodiment of the present technology.

FIG. 13 is an exemplary sequence diagram at the time of transition from one of the discharge normal mode and the charge state to the other state in the first embodiment. In the discharge normal mode, the power supply management integrated circuit 200 starts to supply power to the processing unit 140 and the like (step S950). Furthermore, the power supply management integrated circuit 200 reads the measurement cycle corresponding to the discharge normal mode (step S951) and measures the battery remaining quantity each time when the measurement cycle elapses (step S952). The measured value is transmitted to the processing unit 140 each time when the battery remaining quantity is measured, and the processing unit 140 makes the display 150 display an icon indicating the battery remaining quantity on the basis of the measured value (step S960).

Then, when the power supply device is attached to the connector 110, the power supply management integrated circuit 200 detects the attachment and starts charging (step S953) and transmits the charging signal which is set to "1" to the processing unit 140. With this processing, the charge/discharge state of the secondary battery 120 shifts to the charge state.

In the charge state, the processing unit 140 makes the display 150 display the icon indicating that the charging is in progress (step S961). Furthermore, the power supply management integrated circuit 200 reads the measurement cycle corresponding to the charge state (step S954) and measures the battery remaining quantity each time when the measurement cycle elapses (step S955).

Note that the processing unit 140 may further display the battery remaining quantity together with the icon indicating that the charging is in progress.

Then, when the power supply device is detached from the connector 110, the power supply management integrated circuit 200 detects the detachment and terminates charging (step S956), and transmits the charging signal which is set to "0" to the processing unit 140. With this processing, the charge/discharge state of the secondary battery 120 shifts to the discharge normal mode.

In the discharge normal mode, the processing unit 140 makes the display 150 display the icon indicating the battery remaining quantity on the basis of the measured value from the power supply management integrated circuit 200 (step S962). Furthermore, the power supply management integrated circuit 200 reads the measurement cycle corresponding to the discharge normal mode (step S957) and measures the battery remaining quantity each time when the measurement cycle elapses (step S958).

Here, a comparative example is assumed in which the power supply management integrated circuit 200 measures the terminal voltage Vbat in response to the instruction from the processing unit 140 and transmits the measured value to the processing unit 140 and the processing unit 140 obtains the battery remaining quantity from the measured value. In this comparative example, it is necessary for the processing unit 140 to transmit a measurement instruction to the power supply management integrated circuit 200 at every measurement. Furthermore, the processing unit 140 needs to transmit the measurement cycle to the power supply management integrated circuit 200 each time when the charge/discharge state changes. In addition, the processing unit 140 needs to perform processing of calculating the battery remaining quantity and processing of changing the measurement cycle.

Whereas, the power supply management integrated circuit 200 determines the charge/discharge state and measures the battery remaining quantity at the measurement cycle corresponding to the current state. Therefore, it is not necessary for the processing unit 140 to transmit the measurement instruction and the measurement cycle to the power supply management integrated circuit 200. With this processing, an amount of communication with the processing unit 140 can be reduced. Furthermore, the processing unit 140 does not need to perform the processing of calculating the battery remaining quantity and the processing of changing the measurement cycle. Therefore, a processing amount of the processing unit 140 can be reduced. As a result, software to be mounted to the processing unit 140 can be simplified, and the electronic device 100 can be controlled at high speed. Furthermore, by increasing the speed of the control, the operation time of the processing unit 140 when predetermined processing is performed can be shortened, and power consumption necessary for the processing can be reduced. Furthermore, by simplifying the software, it is possible to reduce cost required for development, design and the like.

Figure 14:
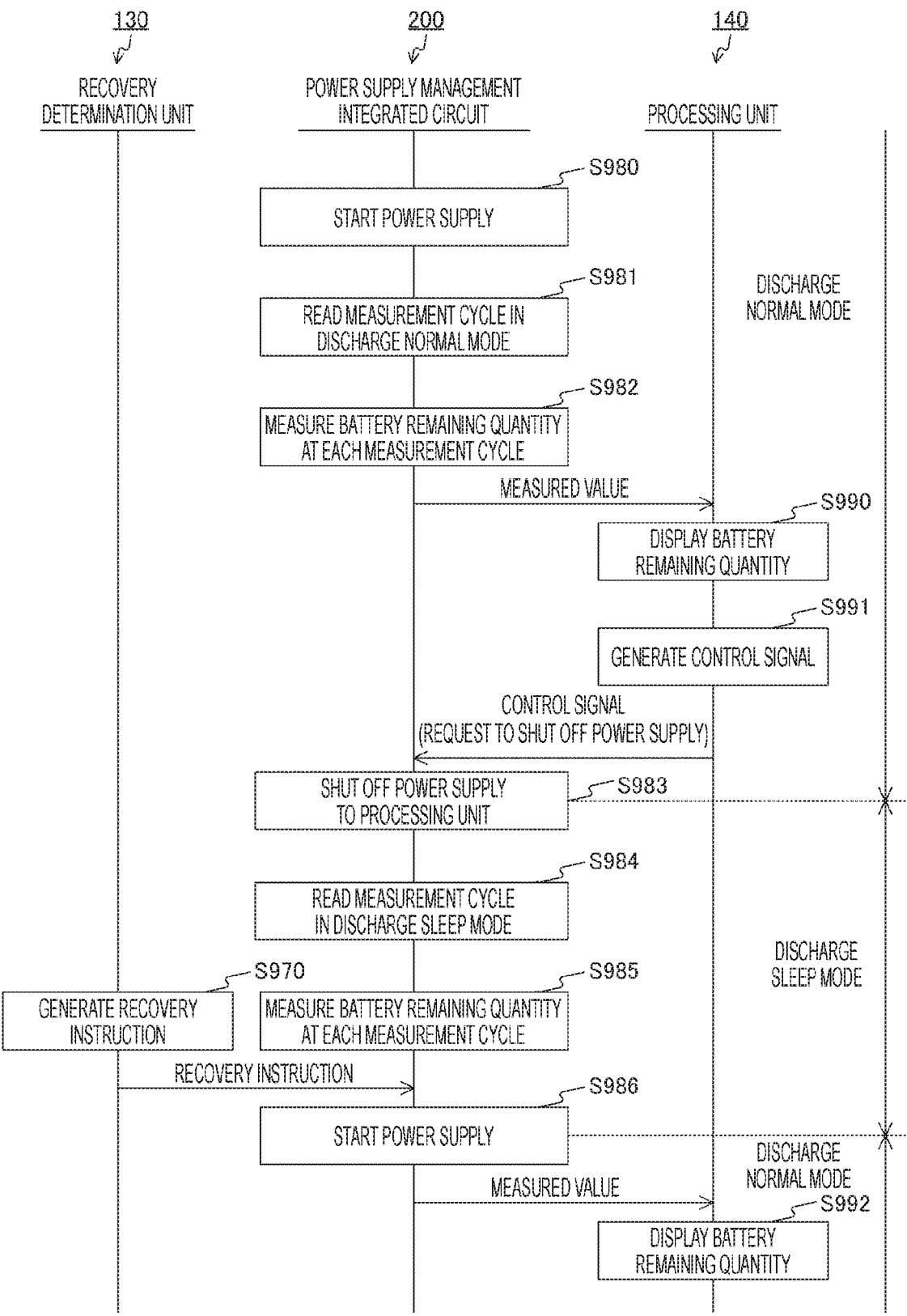
FIG. 14 is an exemplary sequence diagram at the time of transition from one of the discharge normal mode and a discharge sleep mode to the other mode in the first embodiment of the present technology.

FIG. 14 is an exemplary sequence diagram at the time of transition from one of the discharge normal mode and the discharge sleep mode to the other mode in the first embodiment. In the discharge normal mode, the power supply management integrated circuit 200 starts to supply power to the processing unit 140 and the like (step S980). Furthermore, the power supply management integrated circuit 200 reads the measurement cycle corresponding to the discharge normal mode (step S981) and measures the battery remaining quantity each time when the measurement cycle elapses (step S982). The measured value is transmitted to the processing unit 140 each time when the battery remaining quantity is measured, and the processing unit 140 makes the display 150 display the icon indicating the battery remaining quantity on the basis of the measured value (step S990).

Then, in a case where a user's operation is not performed for a fixed time or longer, the processing unit 140 generates the control signal requesting to shut off the power supply and transmits the control signal to the power supply management integrated circuit 200 (step S991). In accordance with the control signal, the power supply management integrated circuit 200 shuts off the power supply to the processing unit 140 and the like (step S983). With this operation, the charge/discharge state of the secondary battery 120 shifts to the discharge sleep mode.

In the discharge sleep mode, the power supply management integrated circuit 200 reads the measurement cycle corresponding to the mode (step S984) and measures the battery remaining quantity each time when the measurement cycle elapses (step S985). When a switch operation for recovery and the like is performed, the recovery determination unit 130 generates the recovery instruction and transmits the recovery instruction to the power supply management integrated circuit 200 (step S970). In accordance with the recovery instruction, the power supply management integrated circuit 200 restarts the power supply to the processing unit 140 and the like (step S986). With this processing, the charge/discharge state of the secondary battery 120 shifts to the discharge normal mode.

In the discharge normal mode, the processing unit 140 acquires the measured value from the power supply management integrated circuit 200 and makes the display 150 display the icon indicating the battery remaining quantity on the basis of the measured value (step S992).

In this way, when the mode is transitioned from one of the discharge normal mode and the discharge sleep mode to the other mode, it is not necessary for the processing unit 140 to transmit the measurement cycle to the power supply management integrated circuit 200. Therefore, the amount of communication with the processing unit 140 can be reduced. Furthermore, since the processing unit 140 does not need to perform the processing of calculating the battery remaining quantity, the processing amount of the processing unit 140 can be reduced.

Figure 15:
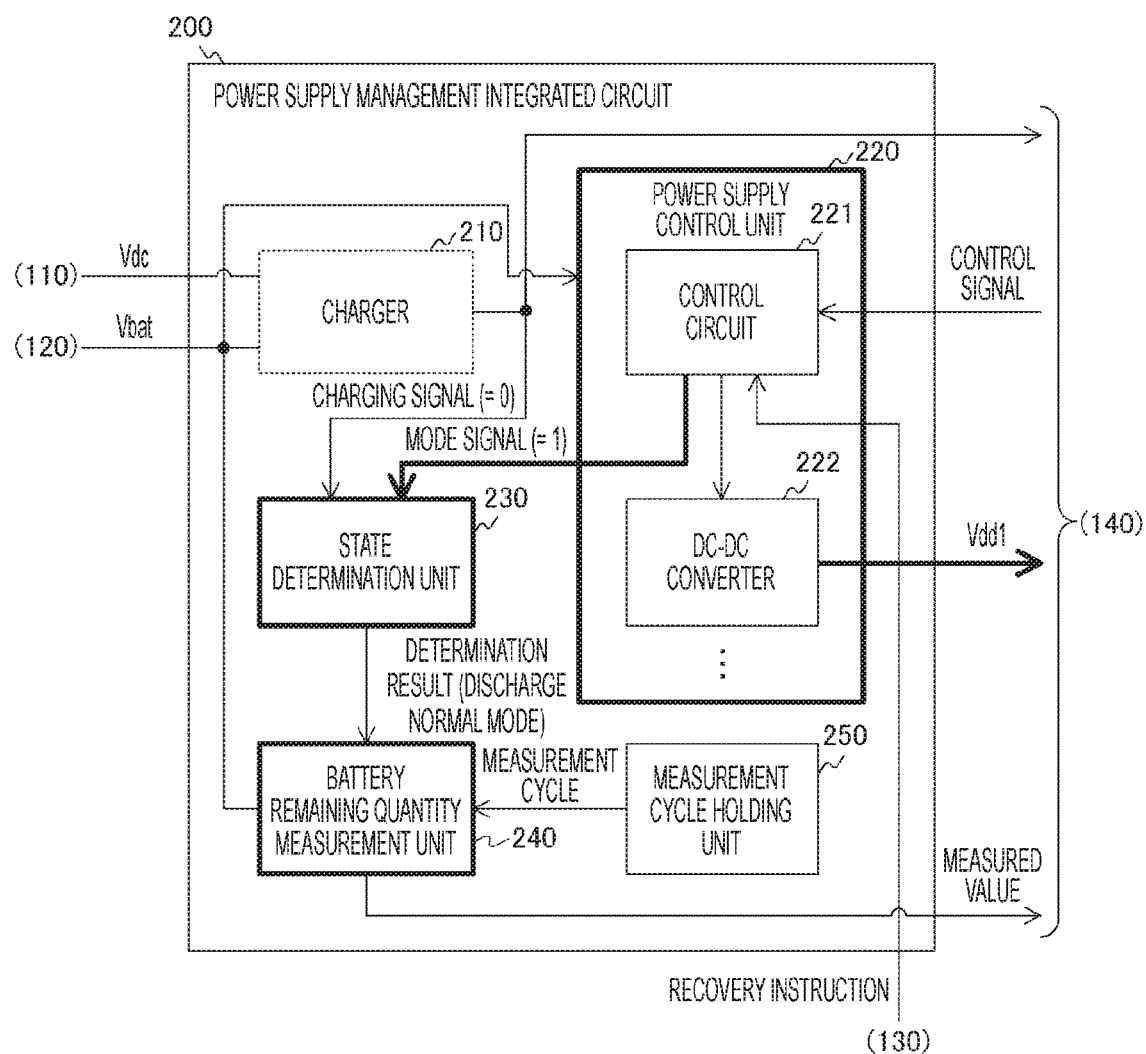
FIG. 15 is a diagram to describe a state of the power supply management integrated circuit in the discharge normal mode according to the first embodiment of the present technology.

FIG. 15 is a diagram to describe a state of the power supply management integrated circuit 200 in the discharge normal mode according to the first embodiment. In the discharge normal mode, the power supply control unit 220 converts the terminal voltage Vbat into an output voltage Vdd1 and the like and supplies the converted voltage to the processing unit 140. Furthermore, the mode signal of "1" is supplied to the state determination unit 230. Furthermore, the charger 210 is stopped, and "0" is set to the charging signal.

The state determination unit 230 determines that the charge/discharge state is the discharge normal mode on the basis of the charging signal and the mode signal. The battery remaining quantity measurement unit 240 reads the measurement cycle corresponding to the discharge normal mode from, the measurement cycle holding unit 250 and measures the battery remaining quantity at the measurement cycle.

In this way, in the discharge normal mode, only the charger 210 of the circuits in the power supply management integrated circuit 200 is stopped.

Figure 16:
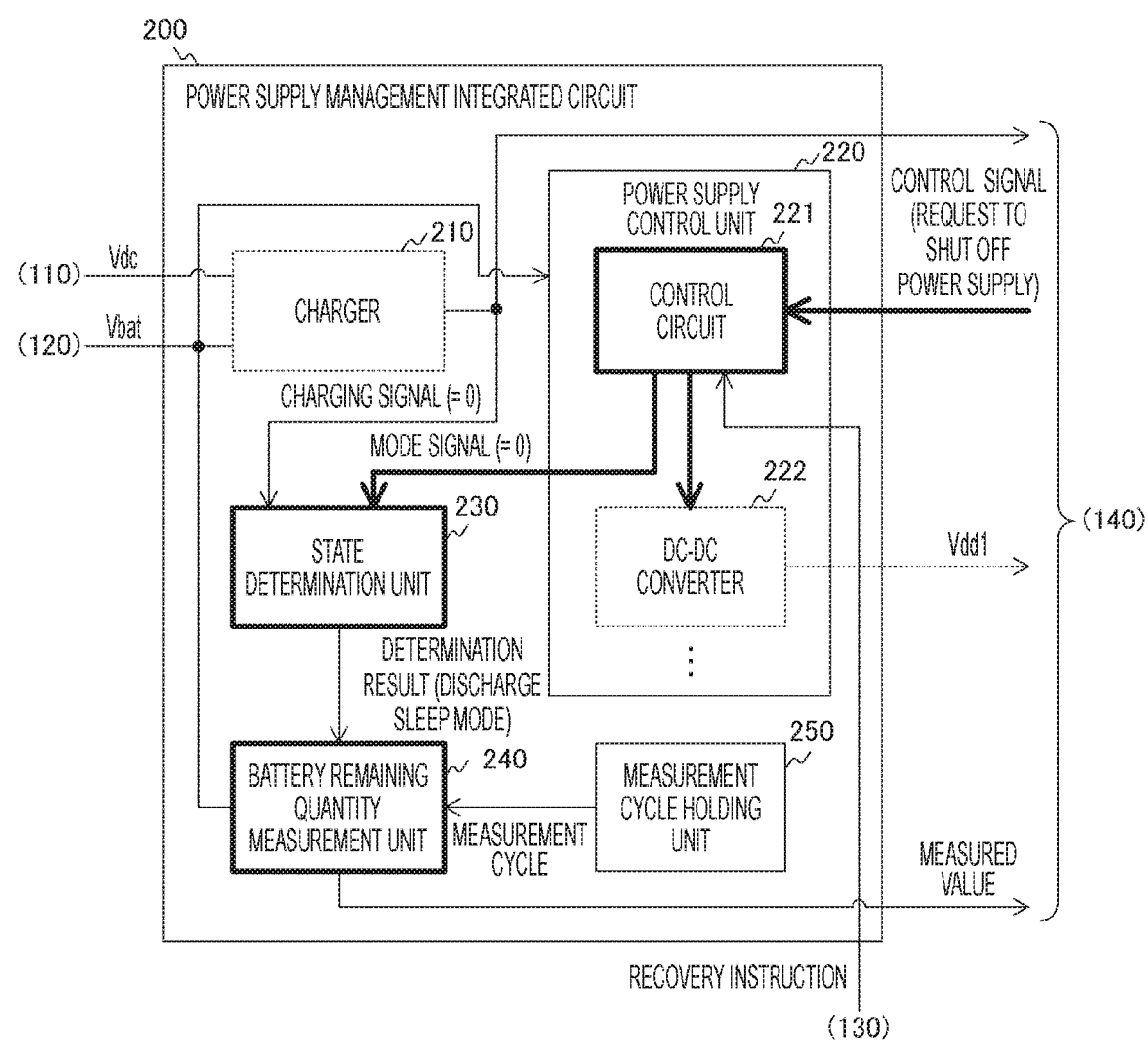
FIG. 16 is a diagram to describe a state of the power supply management integrated circuit in the discharge sleep mode according to the first embodiment of the present technology.

FIG. 16 is a diagram to describe a state of the power supply management integrated circuit 200 in the discharge sleep mode according to the first embodiment. The control circuit 221 stops the DC-DC converters 222 and the like in accordance with the control signal requesting to shut off the power supply. Furthermore, the control circuit 221 supplies the mode signal of "0" to the state determination unit 230. The charger 210 is stopped, and "0" is set to the charging signal.

The state determination unit 230 determines that the charge/discharge state is the discharge sleep mode on the basis of the charging signal and the mode signal. The battery remaining quantity measurement unit 240 reads the measurement cycle corresponding to the discharge sleep mode from the measurement cycle holding unit 250 and measures the battery remaining quantity at the measurement cycle.

In this way, in the discharge sleep mode, the charger 210, the DC-DC converters 222, and the like of the circuits in the power supply management integrated circuit 200 are stopped.

Figure 17:
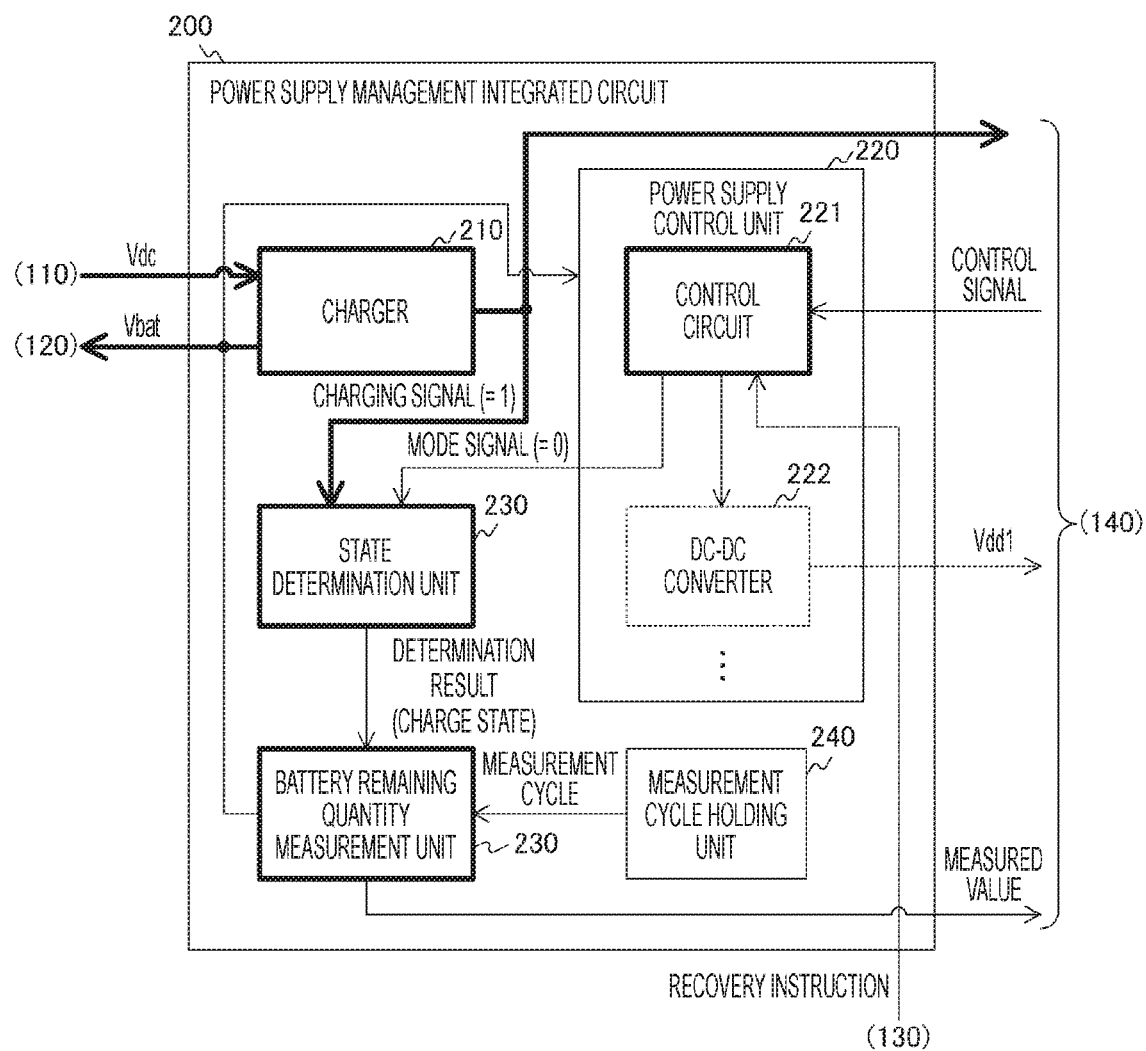
FIG. 17 is a diagram to describe a state of the power supply management integrated circuit in the charge state according to the first embodiment of the present technology.

FIG. 17 is a diagram to describe a state of the power supply management integrated circuit 200 in the charge state according to the first embodiment. When the power supply device is attached in the discharge sleep mode, the charger 210 charges the secondary battery 120 by using the supply voltage Vdc from the power supply device. Furthermore, the charger 210 supplies the charging signal which is set to "1" to the state determination unit 230. Furthermore, "0" is set to the mode signal.

The state determination unit 230 determines that the charge/discharge state is the charge state on the basis of the charging signal and the mode signal. The battery remaining quantity measurement unit 240 reads the measurement cycle corresponding to the charge state from the measurement cycle holding unit 250 and measures the battery remaining quantity at the measurement cycle.

In this way, in the charge state, the charger 210 operates. Furthermore, when the state is transitioned from the discharge sleep mode to the charge state, the DC-DC converter 222 and the like are stopped.

In this way, according to the first embodiment of the present technology, the power supply management integrated circuit 200 determines the charge/discharge state of the secondary battery 120 and measures the battery remaining quantity at the measurement cycle corresponding to the determined state. Therefore, it is not necessary for the processing unit 140 to transmit the measurement cycle to the power supply management integrated circuit 200. With this processing, the amount of communication with the processing unit 140 can be reduced. In addition, since it is not necessary for the processing unit 140 to perform the processing regarding the measurement of the battery remaining quantity, the processing amount of the processing unit 140 can be reduced.

2. Second Embodiments

In the first embodiment described above, the discharge state is classified into two modes, i.e., the discharge normal mode and the discharge sleep mode by difference of the power consumption, and the measurement cycle corresponding to each mode is set. However, in each of the discharge normal mode and the discharge sleep mode, the discharge rate may change depending on the battery remaining quantity. For example, in a lithium ion battery or the like, when the battery remaining quantity is equal to or less than a predetermined value, the discharge rate tends to increase. Therefore, from the viewpoint of accurately grasping a temporal fluctuation of the battery remaining quantity, it is desirable that the measurement cycle of the battery remaining quantity be short when the battery remaining quantity is equal to or less than the predetermined value. A power supply management integrated circuit 200 according to the second embodiment is different from that in the first embodiment in that the battery remaining quantity is measured at the measurement cycle according to the battery remaining quantity.

Figure 18:
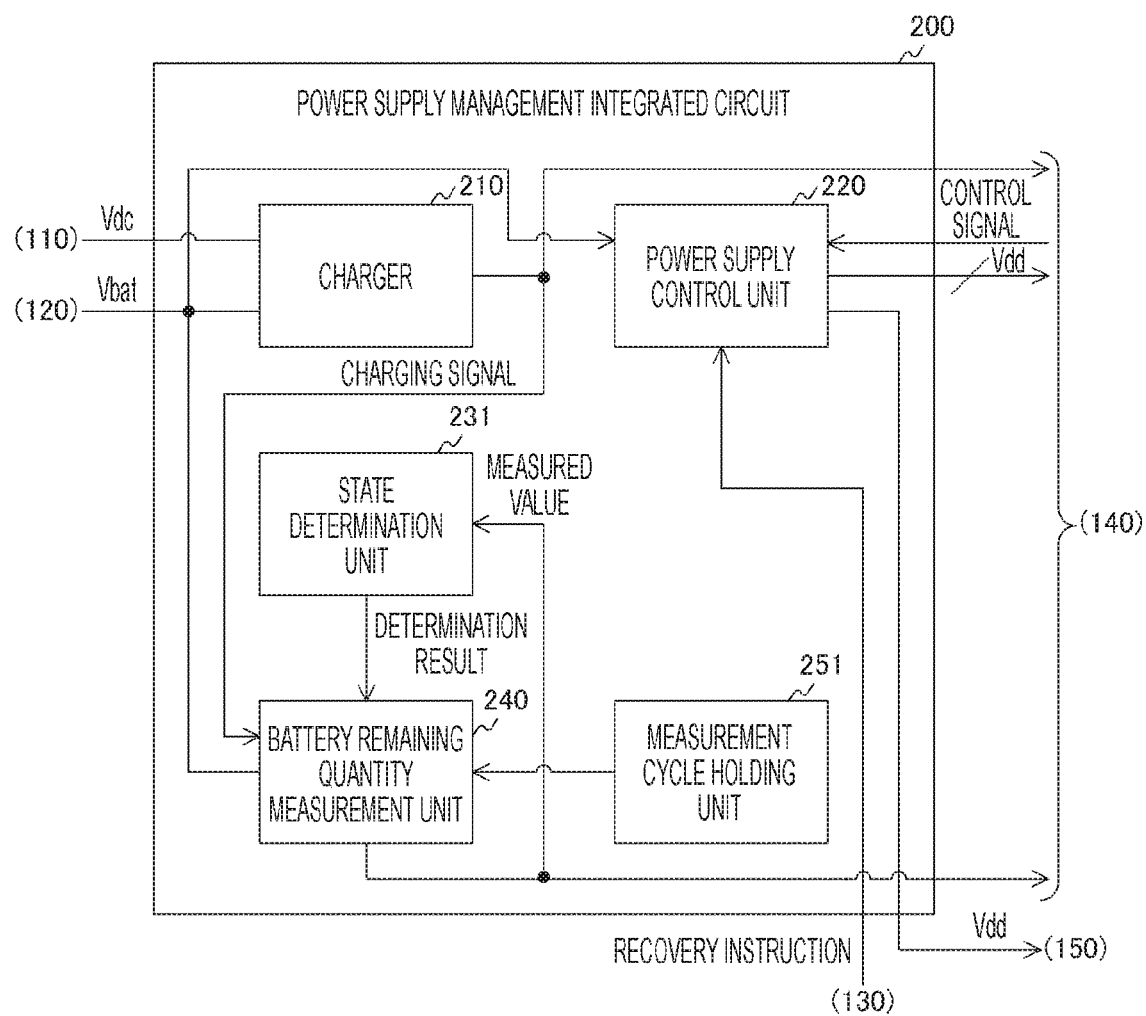
FIG. 18 is a block diagram of an exemplary configuration of a power supply management integrated circuit according to a second embodiment of the present technology.

FIG. 18 is a block diagram of an exemplary configuration of the power supply management integrated circuit 200 according to the second embodiment. The power supply management integrated circuit 200 according to the second embodiment is different from that in the first embodiment in that a state determination unit 231 and a measurement cycle holding unit 251 are included instead of the state determination unit 230 and the measurement cycle holding unit 250.

The state determination unit 231 acquires a measured value from a battery remaining quantity measurement unit 240 and determines which one of a plurality of states having a different range of the battery remaining quantity the charge/discharge state falls under. The measurement cycle holding unit 251 holds a measurement cycle in association with each of the states.

Furthermore, the battery remaining quantity measurement, unit 240 according to the second embodiment is different from that in the first embodiment which further receives a charging signal. The battery remaining quantity measurement unit 240 measures the battery remaining quantity at the measurement cycle corresponding to the state indicated by the determination result in the discharge state and does not perform the measurement in the charge state.

Figures 19, 20:
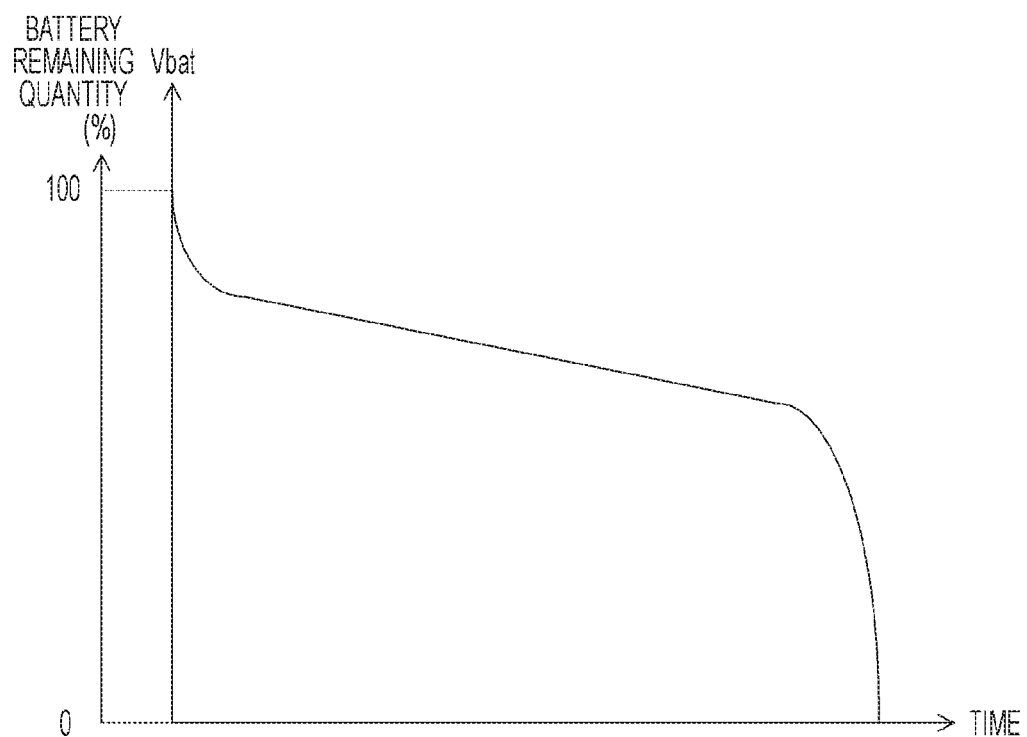
FIG. 19 is a graph of exemplary discharge characteristics of a secondary battery according to the second embodiment of the present technology.
FIG. 20 is a diagram of exemplary measurement cycles for respective states according to the second embodiment of the present technology.

FIG. 19 is a graph of exemplary discharge characteristics of a secondary battery 120 according to the second embodiment. In FIG. 19, the vertical axis represents a terminal voltage Vbat of the secondary battery 120, and the horizontal axis represents time. In FIG. 19, a temporal change in the terminal voltage Vbat at the time when the secondary battery 120 is discharged in a state where a load of a certain capacity is connected to the secondary battery 120 is illustrated.

Regarding a discharge curve, the terminal voltage Vbat rapidly decreases close to the maximum value and the minimum value of the terminal voltage Vbat. In other words, a discharge rate increases close to points where the battery remaining quantity is 100% and where the battery remaining quantity is 0%. It is desirable to shorten the measurement cycle of the battery remaining quantity in a range of the battery remaining quantity in which the discharge rate increases.

FIG. 20 is a diagram of exemplary measurement cycles for respective states according to the second embodiment. For example, a charge/discharge state is classified into four states, i.e., a state where the battery remaining quantity is zero to 25%, a state of 26 to 50%, a state of 51 to 75%, and a state of 76 to 100%.

As described above, the discharge rate increases close to the points where the battery remaining quantity is 100% and where the battery remaining quantity is zero %. Therefore, it is desirable to shorten the measurement cycle of the discharge rate in these ranges. For example, a measurement cycle of 200 milliseconds (ms) is held in association with a state where the battery remaining quantity is zero to 25%. Furthermore, a measurement cycle of 500 milliseconds (ms) is held in association with a state where the battery remaining quantity is 26 to 50%, and a measurement cycle of 1000 milliseconds (ms) is held in association with a state where the battery remaining quantity is 51 to 75%. A measurement cycle of 200 milliseconds (ms) is held in association with a state where the battery remaining quantity is 76 to 100%.

Note that percent is used as a unit of the battery remaining quantity. However, milliampere hour (mAh) and the like may be used. Furthermore, in a case where a battery is used of which the discharge rate is not changed very much close to a point where the battery remaining quantity is 100%, it is not necessary to shorten the measurement cycle in that range. In this case, for example, a measurement cycle of 1000 milliseconds (ms) is held in association with a state where the battery remaining quantity is 76 to 100%.

As described above, according to the second embodiment of the present technology, the power supply management integrated circuit 200 measures the battery remaining quantity at the measurement cycle according to the battery remaining quantity. Therefore, even when the discharge rate fluctuates due to the change in the battery remaining quantity, the battery remaining quantity can be measured at the measurement cycle according to the fluctuated discharge rate.

[Modification]

In the second embodiment described above, the power supply management integrated circuit 200 does not measure the battery remaining quantity in the charge state. However, the power supply management integrated circuit 200 may measure the battery remaining quantity in the charge state. Furthermore, in the discharge state, the power supply management integrated circuit 200 changes the measurement cycle according to the battery remaining quantity regardless of whether the state is the sleep mode. However, the power supply management integrated circuit 200 may change the measurement cycle in consideration of the sleep mode. A power supply management integrated circuit 200 according to a modification of the second embodiment is different from that in the second embodiment in that the battery remaining quantity is measured at the measurement cycle according to each of the charge state and the sleep mode.

Figure 21:
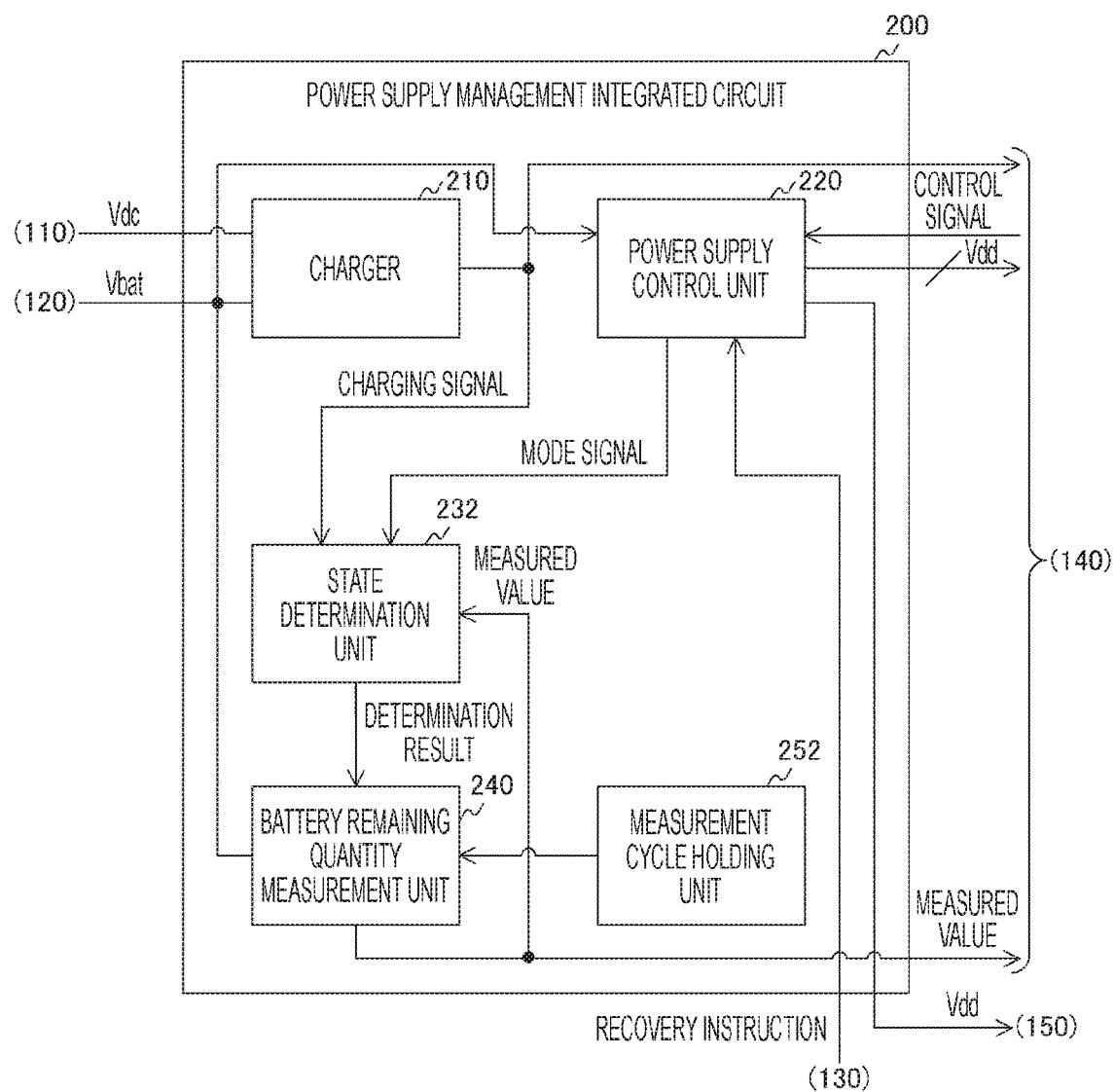
FIG. 21 is a block diagram of an exemplary configuration of a power supply management integrated circuit according to a modification of the second embodiment of the present technology.

FIG. 21 is a block diagram of an exemplary configuration of the power supply management integrated circuit 200 according to the modification of the second embodiment. The power supply management integrated circuit 200 according to the modification of the second embodiment is different from that in the second embodiment in that a state determination unit 232 and a measurement cycle holding unit 252 are included instead of the state determination unit 231 and the measurement cycle holding unit 251.

The state determination unit 232 acquires a measured value of the battery remaining quantity, a mode signal, and a power receiving signal and makes determination on the basis of them. For example, a charge/discharge state is classified into a "charge state", a "discharge normal mode", and a "discharge sleep mode". Then, the "discharge normal mode" is classified into a plurality of states having different ranges of the battery remaining quantity. The measurement cycle holding unit 252 holds a measurement cycle in association with each of these states.

Figure 22:
FIG. 22 is a diagram of exemplary measurement cycles for respective states according to the modification of the second embodiment of the present technology.

FIG. 22 is a diagram of exemplary measurement cycles for respective states according to the modification of the second embodiment. A measurement cycle shorter than that in the discharge state ("discharge normal mode" and "discharge sleep mode") is held in association with the "charge state" as in the first embodiment. Furthermore, the measurement cycle longer than that in the "discharge normal mode" is held in association with the "discharge sleep mode". Furthermore, in the "discharge normal mode", the measurement cycle according to the battery remaining quantity is held.

For example, a measurement cycle of 10 milliseconds (ms) is held in association with the "charge state". In addition, a measurement cycle of $3 \times 10^5$ milliseconds (ms), that is, five minutes is held in association with the "discharge sleep mode".

Furthermore, the "discharge normal mode" is classified into four states, for example, a state where the battery remaining quantity is zero to 25%, a state of 26 to 50%, a state of 51 to 75%, and a state of 76 to 100%. A measurement cycle of 200 milliseconds (ms) is held in association with a state where the battery remaining quantity is zero to 25%. Furthermore, a measurement cycle of 500 milliseconds (ms) is held in association with a state where the battery remaining quantity is 26 to 50%, and a measurement cycle of 1000 milliseconds (ms) is held in association with a state where the battery remaining quantity is 51 to 75%. A measurement cycle of 200 milliseconds (ms) is held in association with a state where the battery remaining quantity is 76 to 100%.

Note that the discharge sleep mode is further classified into a plurality of states having different ranges of the battery remaining quantity, and the battery remaining quantity measurement unit 240 may measure the battery remaining quantity at the measurement cycle corresponding to each of the states.

In this way, according to the modification of the second embodiment of the present technology, the power supply management integrated circuit 200 measures the battery remaining quantity at the measurement cycle shorter than that in the discharge state, in the charge state of the secondary battery 120. Therefore, the battery remaining quantity can be displayed during charging. Furthermore, since the power supply management integrated circuit 200 measures the battery remaining quantity at the measurement cycle longer than that in the discharge normal mode, in the discharge sleep mode, an increase in power consumption can be prevented.

3. Third Embodiment

In the first embodiment described above, the discharge state is classified into two modes, i.e., the discharge normal mode and the discharge sleep mode by difference of the power consumption, and the measurement cycle corresponding to each mode is set. However, in the discharge normal mode, a load current may change due to fluctuation of a processing amount of a processing unit 140, a change in luminance of a display 150, and the like. Here, the load current is the consumed current of a load (processing unit 140, display 150, and the like) connected to a secondary battery 120. The larger the load current is, the faster the discharge rate is. Therefore, from viewpoint of accurately grasping a temporal fluctuation of the battery remaining quantity, it is desirable that the measurement cycle of the battery remaining quantity be shorter as the load current is larger, A power supply management integrated circuit 200 according to a third embodiment is different from that in the first embodiment in that the battery remaining quantity is measured at the measurement cycle according to the load current.

Figure 23:
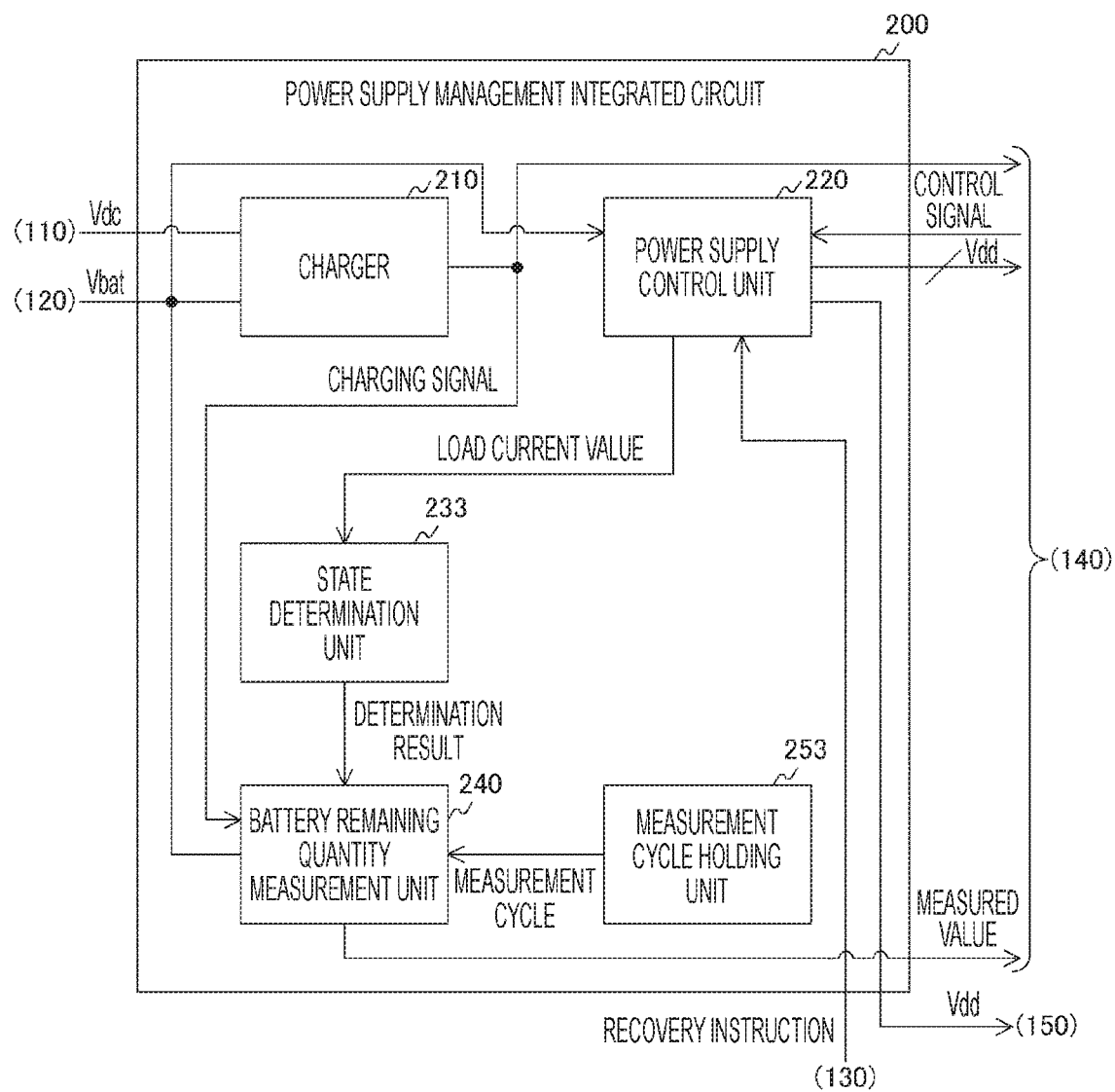
FIG. 23 is a block diagram of an exemplary configuration of a power supply management integrated circuit according to a third embodiment of the present technology.

FIG. 23 is a block diagram of an exemplary configuration of the power supply management integrated circuit 200 according to the third embodiment. The power supply management integrated circuit 200 according to the third embodiment is different from that in the first embodiment in that a state determination unit 233 and a measurement cycle holding unit 253 are included instead of the state determination unit 230 and the measurement cycle holding unit 250.

The state determination unit 233 acquires a value of the load current from a power supply control unit 220 and determines which one of a plurality of states having different ranges of the load current a charge/discharge state falls under. The measurement cycle holding unit 253 holds a measurement cycle in association with each of these states.

Furthermore, the battery remaining quantity measurement unit 240 according to the second embodiment is different from that in the first embodiment in that a charging signal is further received. The battery remaining quantity measurement unit 240 measures the battery remaining quantity at the measurement cycle corresponding to the state indicated by the determination result in the discharge state and does not perform the measurement in the charge state.

Furthermore, the power supply control unit 220 according to the second embodiment is different from that in the first embodiment in that the load current is measured with an ammeter and the like and the measured value is supplied to the state determination unit 233. Note that a structure may be used in which the ammeter is inserted in a previous stage of the power supply control unit 220 and the state determination unit 230 acquires the value of the load current from the ammeter. Depending on the insertion position of the ammeter, a range of the load for increasing or decreasing the load current changes. For example, in a case where the ammeter is inserted immediately before the power supply control unit 220, the power supply control unit 220 is added to the load in addition to the processing unit 140 and the like. Furthermore, in a case where the ammeter is inserted in the previous stage of the power supply management integrated circuit 200, the power supply management integrated circuit 200 is added to the load in addition to the processing unit 140 and the like.

FIG. 24 is a diagram of exemplary measurement cycles for respective states according to the third embodiment. Here, the load current is represented by, for example, a ratio to the maximum value that the load current can be. For example, a charge/discharge state is classified into four states, i.e., a state where the load current is zero to 25%, a state of 26 to 50%, a state of 51 to 75%, and a state of 76 to 100%. The larger the load current is, the greater the temporal fluctuation of the battery remaining quantity becomes. Therefore, a shorter measurement cycle is held as the load current is larger.

For example, a measurement cycle of $10^4$ milliseconds (ms), that is, 10 seconds (s) is held in association with a state where the load current is zero to 25%. Furthermore, a measurement cycle of 1000 milliseconds (ms) is held in association with a state where the battery remaining quantity is 26 to 50%, and a measurement cycle of 500 milliseconds (ms) is held in association with a state where the battery remaining quantity is 51 to 75%. A measurement cycle of 200 milliseconds (ms) is held in association with a state where the battery remaining quantity is 76 to 100%.

Note that amperage (A) may be used instead of % as a unit of the load current. Furthermore, the measurement cycle may be set in consideration of the charge state and the sleep mode. In this case, for example, the measurement cycle holding unit 253 holds a measurement cycle shorter than that in the discharge state in association with the "charge state" and holds a measurement cycle longer than that in the "discharge normal mode" in the "discharge sleep mode". Furthermore, the measurement cycle holding unit 253 holds the measurement cycle according to the load current in the "discharge normal mode".

As described above, according to the third embodiment of the present technology, the power supply management integrated circuit 200 measures the battery remaining quantity at the shorter measurement cycle as the load current is larger. Therefore, even when a discharge rate fluctuates due to the change in the load current, the battery remaining quantity can be measured at the measurement cycle according to the fluctuated discharge rate.

Note that the embodiments indicate examples for embodying the present technology, and matters in the embodiments and invention specifying matters in claims have correspondence relations. Similarly, the invention specifying matters in claims and the matters in the embodiments of the present technology denoted by the same names have correspondence relations. However, the present technology is not limited to the embodiments, and can be embodied by applying various modifications to the embodiments without departing from the scope of the present technology.

Furthermore, the processing procedure described in the above embodiments may be understood as a method having the series of procedures, a program for causing a computer to execute the series of procedures, or a recording medium for storing the program. As the recording medium, for example, a compact disc (CD), a mini disc (MD), a digital versatile disc (DVD), a memory card, a Blu-ray (registered trademark) disc, or the like can be used.

Note that the effects described herein are not necessarily limited and that the effect may be any effects described in the present disclosure.

Note that, the present technology can have the following configuration.

(1) A power supply management integrated circuit including:

a state determination unit configured to determine which one of a plurality of states corresponding to different cycles a charge/discharge state of a battery falls under; and a battery remaining quantity measurement unit configured to measure a battery remaining quantity of the battery each time when the cycle corresponding to the determined state elapses.

(2) The power supply management integrated circuit according to (1), in which the plurality of states includes a plurality of discharge states respectively having different discharge rates, and the cycle is shorter as the discharge rate is faster.

(3) The power supply management integrated circuit according to (2), in which each of the plurality of discharge states has a different range of the battery remaining quantity, and the state determination unit determines the charge/discharge state on the basis of the measured battery remaining quantity.

(4) The power supply management integrated circuit according to (2), further including:

an ammeter configured to measure a load current of a load connected to the battery, in which each of the plurality of discharge states has a different range of the load current, and the state determination unit determines the charge/discharge state on the basis of the measured load current.

(5) The power supply management integrated circuit according to any one of (2) to (4), further including:

a power supply control unit configured to control power consumption according to an instruction to shift a state to either one of a normal state where power consumption of an electronic device including the battery exceeds predetermined power and a power saving state where the power consumption exceeds the predetermined power, in which the plurality of discharge states includes the normal state and the power saving state, and the state determination unit determines the charge/discharge state on the basis of the controlled power consumption.

(6) The power supply management integrated circuit according to any one of (1) to (5), in which the plurality of states includes a charge state and a discharge state, and the cycle corresponding to the charge state is shorter than the cycle corresponding to the discharge (7) The power supply management integrated circuit according to (6), further including:

a charger configured to charge the battery, in which the state determination unit determines the charge/discharge state on the basis of whether the charger charges the battery, (8) The power supply management integrated circuit according to any one of (1) to (7), further including:

a holding unit configured to hold the cycle in association with each of the plurality of states, in which the battery remaining quantity measurement unit acquires the cycle corresponding to the determined state from the holding unit.

(9) An electronic device including:

a battery; and a power supply management integrated circuit including: a state determination unit which determines which one of a plurality of states corresponding to different cycles a charge/discharge state of a battery falls under; and a battery remaining quantity measurement unit which measures a battery remaining quantity of the battery each time when the cycle corresponding to the determined state elapses.

(10) A control method of a power supply management integrated circuit including:

a state determination step of determining which one of a plurality of states corresponding to different cycles a charge/discharge state of a battery falls under; and a battery remaining quantity measurement step of measuring a battery remaining quantity of the battery each time when the cycle corresponding to the determined state elapses.

REFERENCE SIGNS LIST

100 Electronic device
110 Connector
120 Secondary battery
130 Recovery determination unit
140 Processing unit
150 Display
200 Power supply management integrated circuit
210 Charger
220 Power supply control unit
221 Control circuit
222 DC-DC converter
223 Low loss regulator
230, 231, 232, 233 State determination unit
240 Battery remaining quantity measurement unit
241 Measurement cycle acquisition unit
242 Intermittent measurement unit
243 Timer
244 Measured value holding unit
250, 251, 252, 253 Measurement cycle holding unit

The invention claimed is:

1. A power supply management integrated circuit comprising:

a state determination unit configured to determine which one of a plurality of states corresponding to different cycles a charge/discharge state of a battery falls under; and a battery remaining quantity measurement unit configured to measure a battery remaining quantity of the battery each time when the cycle corresponding to the determined state elapses, wherein the plurality of states includes a plurality of discharge states respectively having different discharge rates.

2. The power supply management integrated circuit according to claim 1, wherein the cycle is shorter as the discharge rate is faster.

3. The power supply management integrated circuit according to claim 2, wherein each of the plurality of discharge states has a different range of the battery remaining quantity, and the state determination unit determines the charge/discharge state on the basis of the measured battery remaining quantity.

4. The power supply management integrated circuit according to claim 2, further comprising:

an ammeter configured to measure a load current of a load connected to the battery, wherein each of the plurality of discharge states has a different range of the load current, and the state determination unit determines the charge/discharge state on the basis of the measured load current.

5. The power supply management integrated circuit according to claim 2, further comprising:

a power supply control unit configured to control power consumption according to an instruction to shift a state to either one of a normal state where power consumption of an electronic device including the battery exceeds predetermined power and a power saving state where the power consumption does not exceed the predetermined power, wherein the plurality of discharge states includes the normal state and the power saving state, and the state determination unit determines the charge/discharge state on the basis of the controlled power consumption.

6. The power supply management integrated circuit according to claim 1, wherein the plurality of states includes a charge state and a discharge state, and the cycle corresponding to the charge state is shorter than the cycle corresponding to the discharge state.

7. The power supply management integrated circuit according to claim 6, further comprising:

a charger configured to charge the battery, wherein the state determination unit determines the charge/discharge state on the basis of whether the charger charges the battery.

8. The power supply management integrated circuit according to claim 1, further comprising:

a holding unit configured to hold the cycle in association with each of the plurality of states, wherein the battery remaining quantity measurement unit acquires the cycle corresponding to the determined state from the holding unit.

9. An electronic device comprising: a battery; and a power supply management integrated circuit including: a state determination unit which determines which one of a plurality of states corresponding to different cycles a charge/discharge state of a battery falls under; and a battery remaining quantity measurement unit which measures a battery remaining quantity of the battery each time when the cycle corresponding to the determined state elapses, wherein the plurality of states includes a plurality of discharge states respectively having different discharge rates.

10. A control method of a power supply management integrated circuit comprising:

a state determination step of determining which one of a plurality of states corresponding to different cycles a charge/discharge state of a battery falls under; and a battery remaining quantity measurement step of measuring a battery remaining quantity of the battery each time when the cycle corresponding to the determined state elapses, wherein the plurality of states includes a plurality of discharge states respectively having different discharge rates.

11. The electronic device according to claim 9, wherein the cycle is shorter as the discharge rate is faster.

12. The electronic device according to claim 11, wherein
each of the plurality of discharge states has a different range of the battery remaining quantity, and
the state determination unit determines the charge/discharge state on the basis of the measured battery remaining quantity.

13. The electronic device according to claim 11, further comprising:
an ammeter configured to measure a load current of a load connected to the battery, wherein
each of the plurality of discharge states has a different range of the load current, and
the state determination unit determines the charge/discharge state on the basis of the measured load current.

14. The electronic device according to claim 11, further comprising:
a power supply control unit configured to control power consumption according to an instruction to shift a state to either one of a normal state where power consumption of an electronic device including the battery exceeds predetermined power and a power saving state where the power consumption does not exceed the predetermined power, wherein
the plurality of discharge states includes the normal state and the power saving state, and
the state determination unit determines the charge/discharge state on the basis of the controlled power consumption.

15. The electronic device according to claim 9, wherein
the plurality of states includes a charge state and a discharge state, and
the cycle corresponding to the charge state is shorter than the cycle corresponding to the discharge state.

16. The electronic device according to claim 15, further comprising:
a charger configured to charge the battery, wherein
the state determination unit determines the charge/discharge state on the basis of whether the charger charges the battery.

17. The electronic device according to claim 9, further comprising:
a holding unit configured to hold the cycle in association with each of the plurality of states, wherein
the battery remaining quantity measurement unit acquires the cycle corresponding to the determined state from the holding unit.

18. The electronic device according to claim 9, further comprising an electronic processor that is distinct from the power supply management integrated circuit.

19. The power supply management integrated circuit according to claim 1, wherein, to determine which one of a plurality of states corresponding to different cycles a charge/discharge state of a battery falls under, the state determination unit is further configured to continuously determine the one of the plurality of states based on a charging signal from a charger and a mode signal from a power supply control unit.

* * * * *